United States Patent
Yang et al.

(10) Patent No.: US 11,017,869 B2
(45) Date of Patent: *May 25, 2021

(54) PROGRAMMING PROCESS COMBINING ADAPTIVE VERIFY WITH NORMAL AND SLOW PROGRAMMING SPEEDS IN A MEMORY DEVICE

(71) Applicant: SanDisk Technologies LLC, Addison, TX (US)

(72) Inventors: Xiang Yang, Santa Clara, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/893,626

(22) Filed: Jun. 5, 2020

(65) Prior Publication Data
US 2020/0303025 A1 Sep. 24, 2020

Related U.S. Application Data

(63) Continuation of application No. 16/189,200, filed on Nov. 13, 2018.

(51) Int. Cl.
*G11C 16/06* (2006.01)
*G11C 16/34* (2006.01)
(Continued)

(52) U.S. Cl.
CPC ...... *G11C 16/3459* (2013.01); *G11C 11/5628* (2013.01); *G11C 16/0483* (2013.01);
(Continued)

(58) Field of Classification Search
CPC ............ G11C 11/5628; G11C 11/5642; G11C 16/0483
(Continued)

(56) References Cited

U.S. PATENT DOCUMENTS 7,073,103 B2  7/2006  Gongwer et al.
7,092,290 B2  8/2006  Hemink
(Continued)

OTHER PUBLICATIONS

Response to Office Action dated Jun. 8, 2020, U.S. Appl. No. 16/189,200, filed Nov. 13, 2018.
(Continued)

*Primary Examiner* — Huan Hoang
*Assistant Examiner* — Minh Dinh
(74) *Attorney, Agent, or Firm* — Vierra Magen Marcus LLP

(57) ABSTRACT

Techniques are provided to adaptively determine when to begin verify tests for memory cells during a program operation. The memory cells are programmed using a normal programming speed until their threshold voltage exceeds an initial verify voltage. The memory cells are then programmed further using a reduced programming speed until their threshold voltage exceeds a final verify voltage. In one aspect, a count of memory cells which exceeds the initial verify voltage is used to determine when to begin verify tests for a higher data state. In another aspect, a count of the higher state memory cells which exceeds the initial or final verify voltage is used to determine when to begin verify tests for the higher data state. The counted memory cells are not subject to the reduced programming speed.

20 Claims, 25 Drawing Sheets

(51) Int. Cl.
  *G11C 11/56* (2006.01)
  *G11C 16/26* (2006.01)
  *G11C 16/04* (2006.01)
  *G11C 16/10* (2006.01)

(52) U.S. Cl.
  CPC .............. *G11C 16/10* (2013.01); *G11C 16/26* (2013.01); *G11C 16/3495* (2013.01); *G11C 2211/5621* (2013.01)

(58) Field of Classification Search
  USPC .................................................. 365/185.22
  See application file for complete search history.

(56) References Cited

U.S. PATENT DOCUMENTS

| | | | |
|---|---|---|---|
| 8,223,556 B2 | 7/2012 | Dutta et al. | |
| 8,300,468 B2 | 10/2012 | Kim | |
| 9,570,179 B2 | 2/2017 | Tseng et al. | |
| 9,959,932 B1 | 5/2018 | Zhang et al. | |
| 10,014,063 B2 * | 7/2018 | Tseng | G11C 29/028 |
| 2013/0077409 A1 | 3/2013 | Shiino et al. | |
| 2017/0125117 A1 * | 5/2017 | Tseng | G11C 11/5628 |
| 2017/0154677 A1 * | 6/2017 | Lim | G11C 11/5628 |
| 2018/0307431 A1 | 10/2018 | Gunnam et al. | |
| 2020/0152282 A1 | 5/2020 | Yang et al. | |
| 2020/0303025 A1 * | 9/2020 | Yang | G11C 16/3495 |

OTHER PUBLICATIONS

Non-final Office Action dated Apr. 16, 2020, U.S. Appl. No. 16/189,200, filed Nov. 13, 2018.
Final Office Action dated Aug. 21, 2020, U.S. Appl. No. 16/189,200, filed Nov. 13, 2018.
Response to Final Office Action dated Oct. 6, 2020, U.S. Appl. No. 16/189,200, filed Nov. 13, 2018.
Notice of Allowance dated Oct. 30, 2020, U.S. Appl. No. 16/189,200, filed Nov. 13, 2018.

* cited by examiner

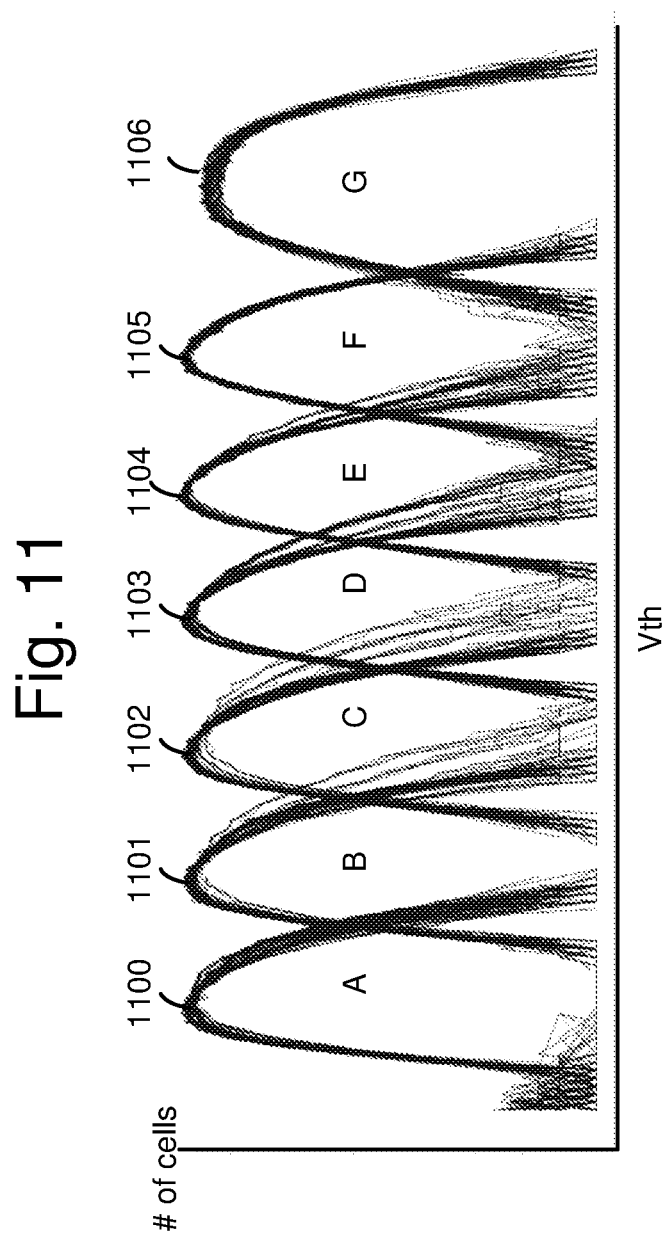

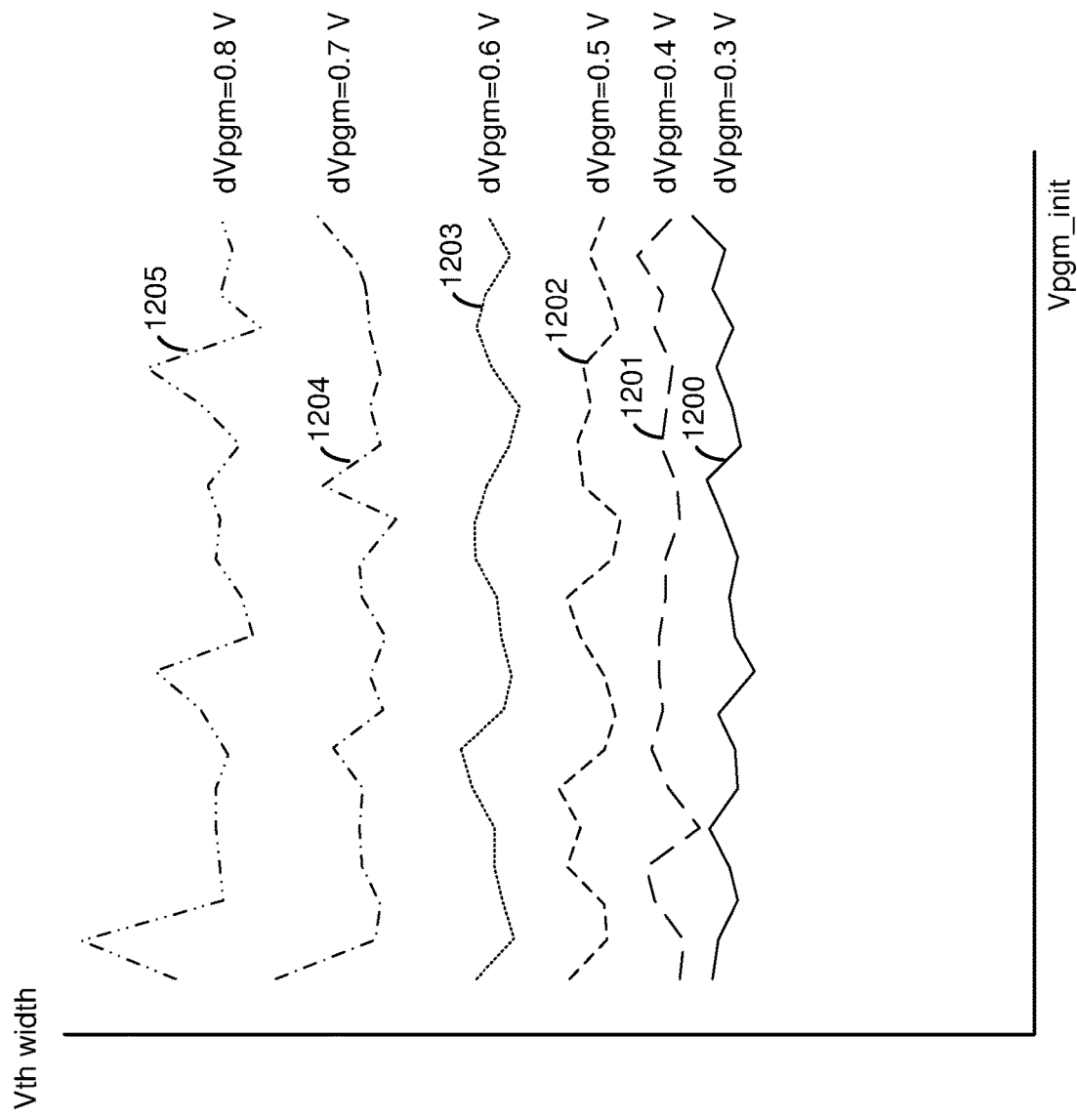

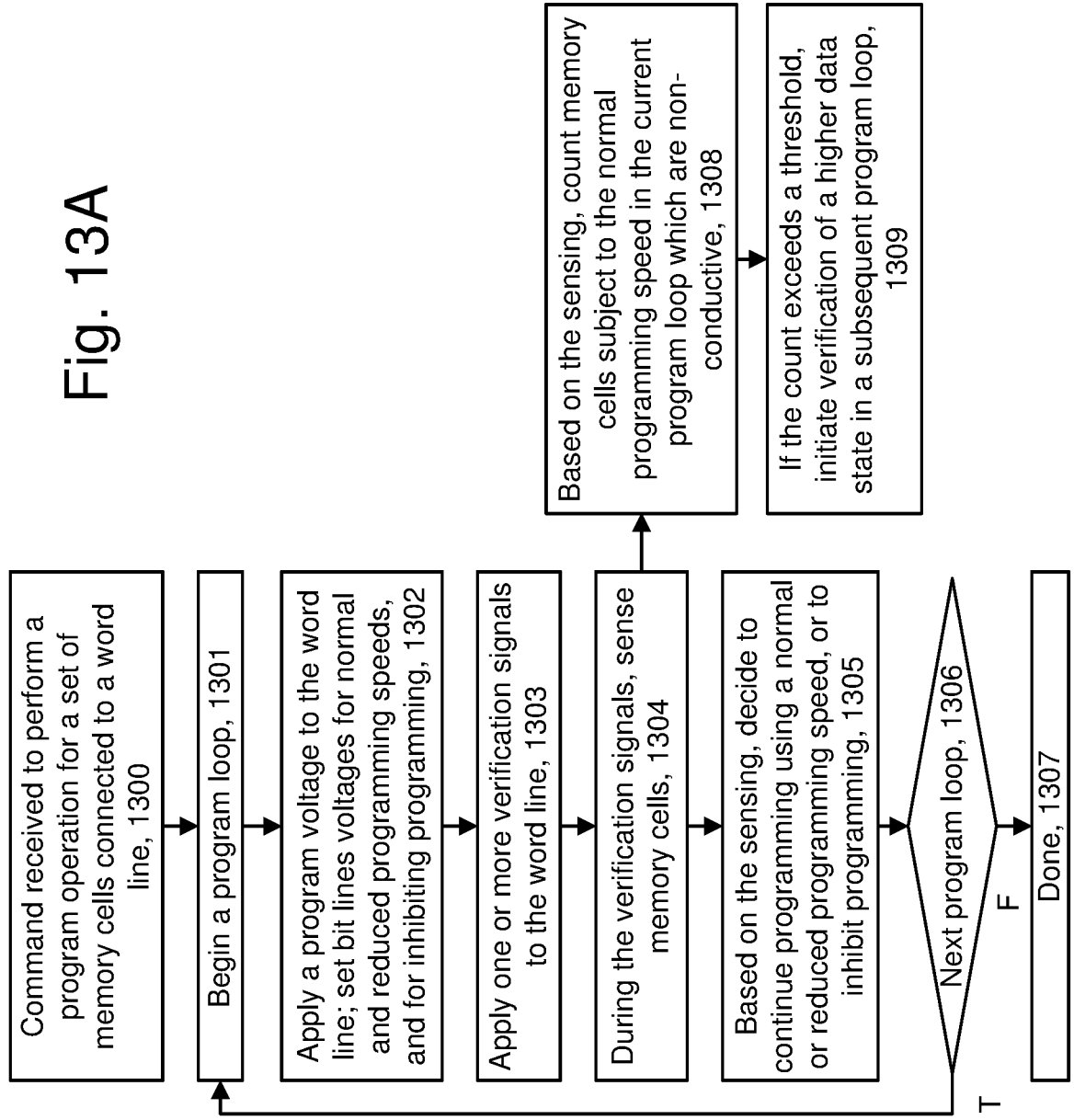

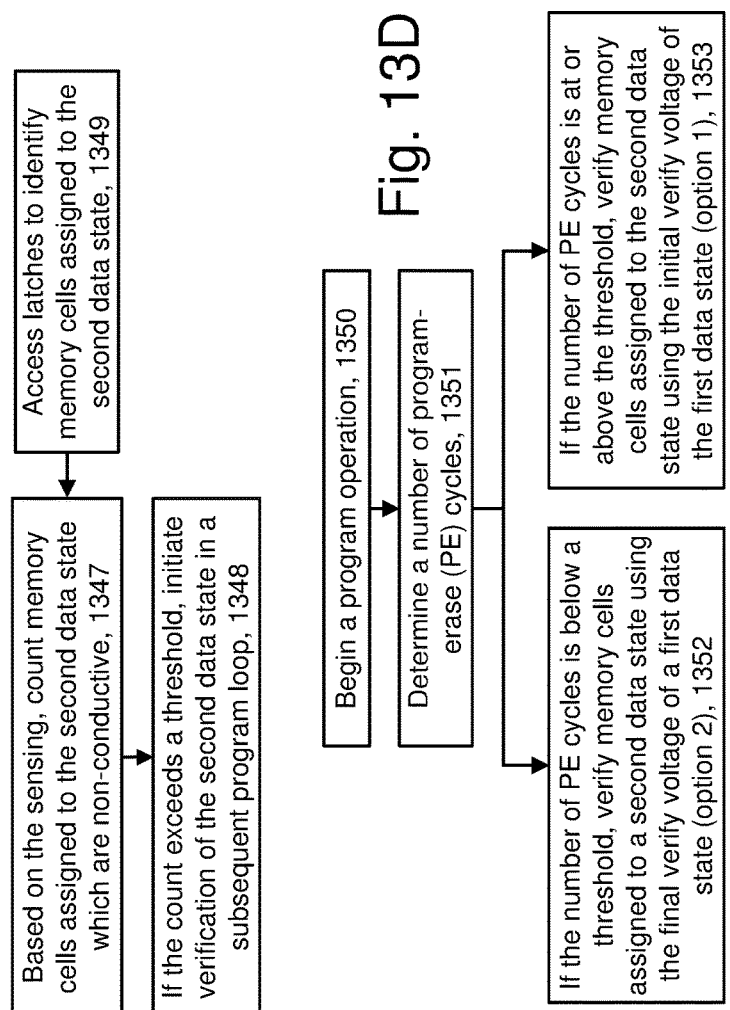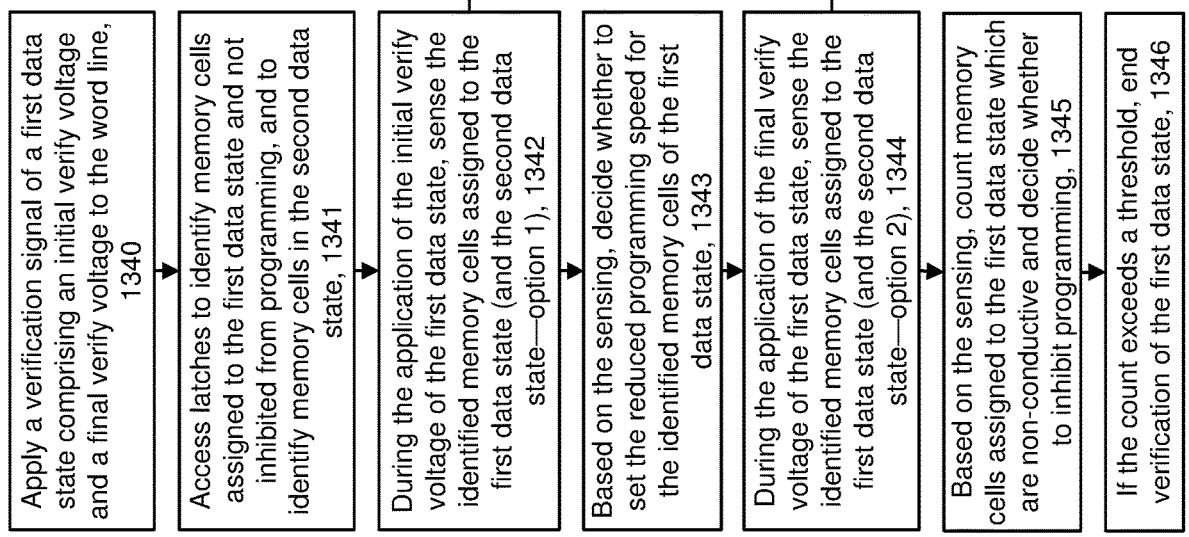

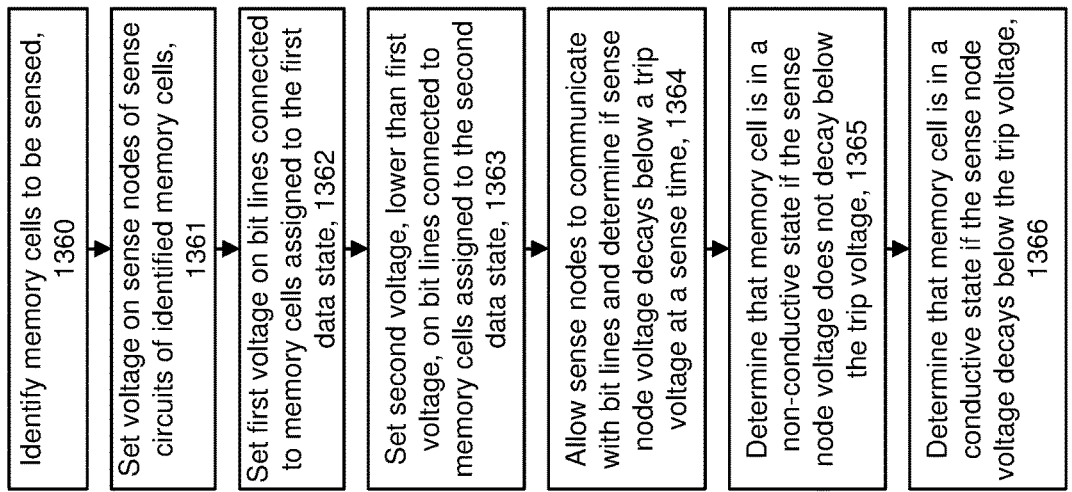
Fig. 13H
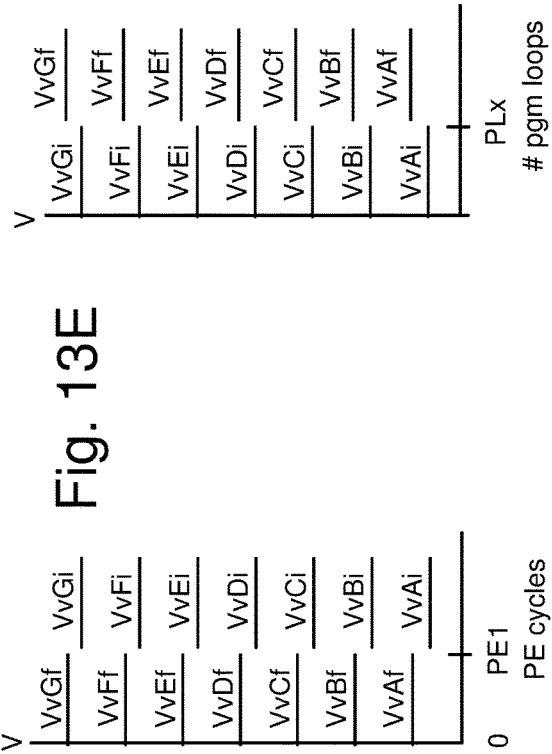
Fig. 13F
Fig. 13E
Fig. 13G

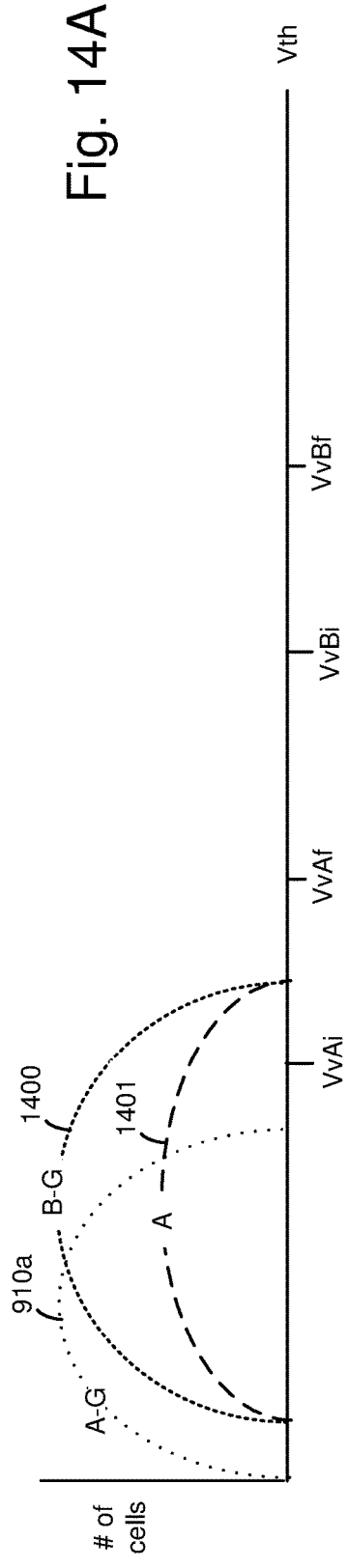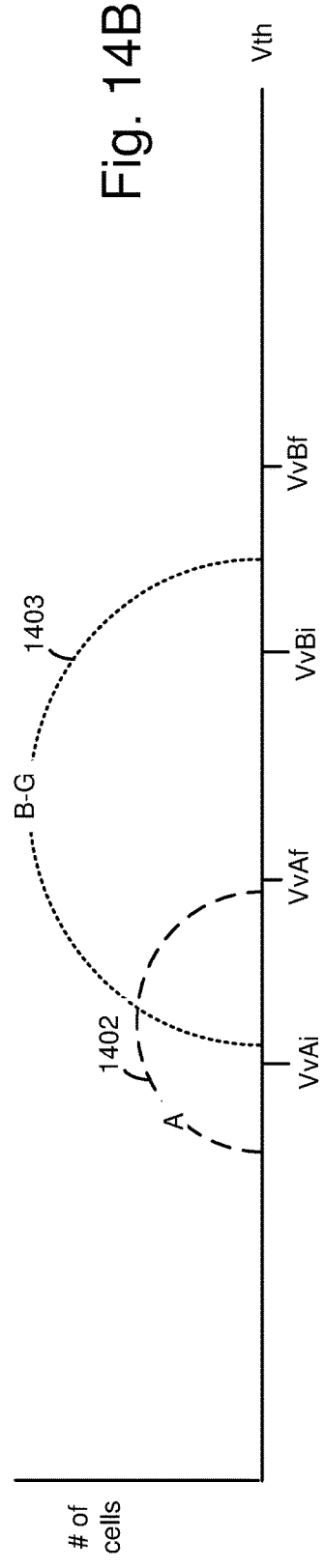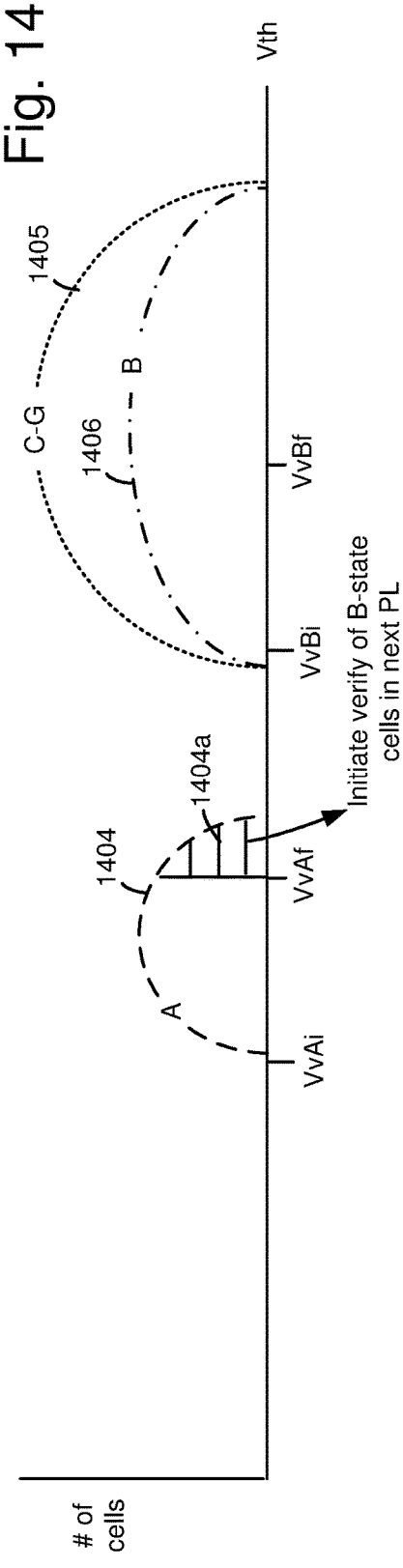

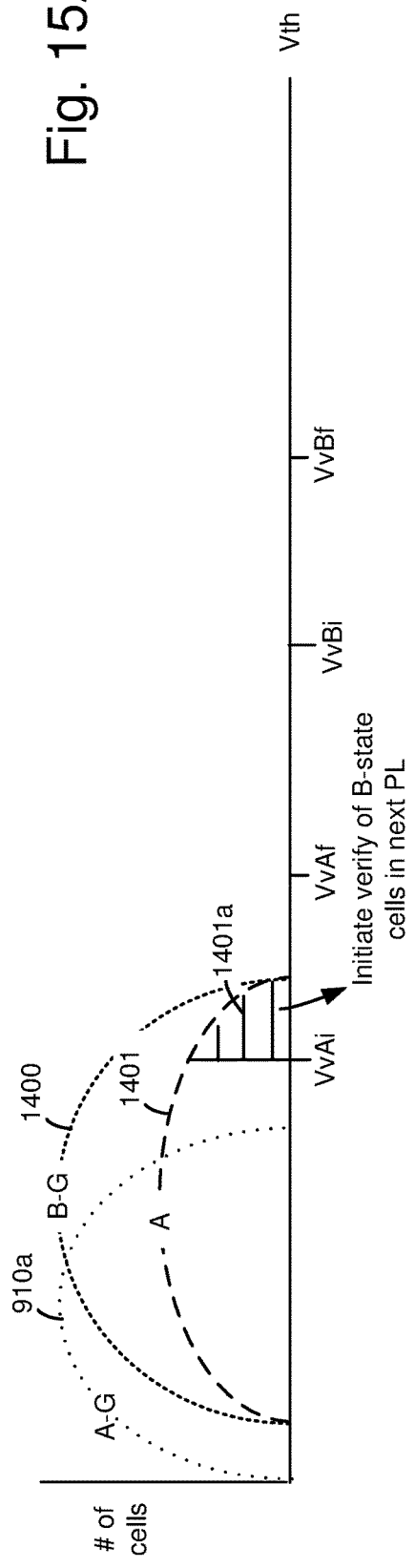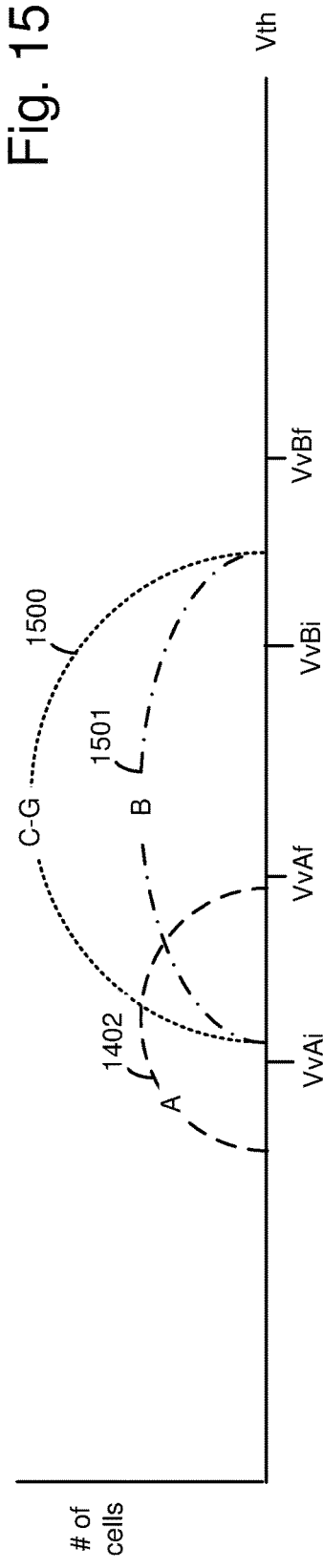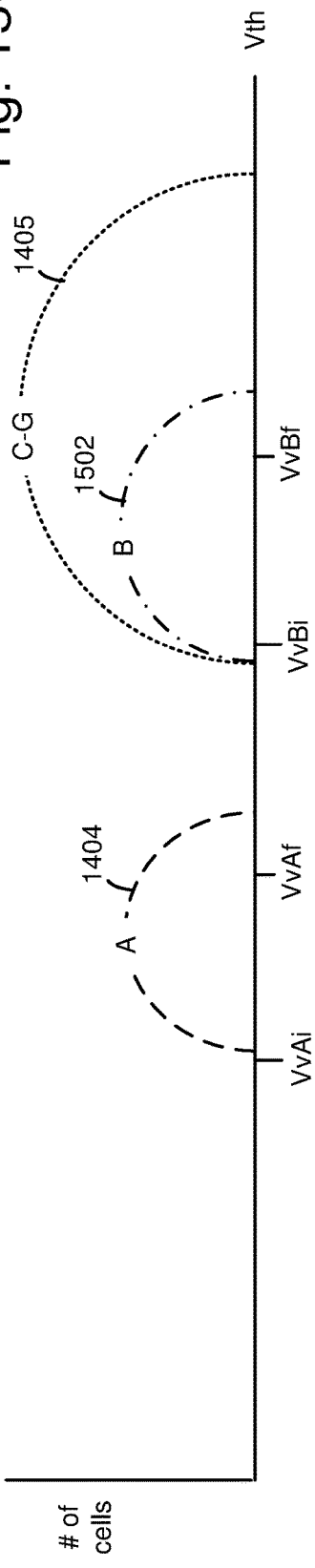

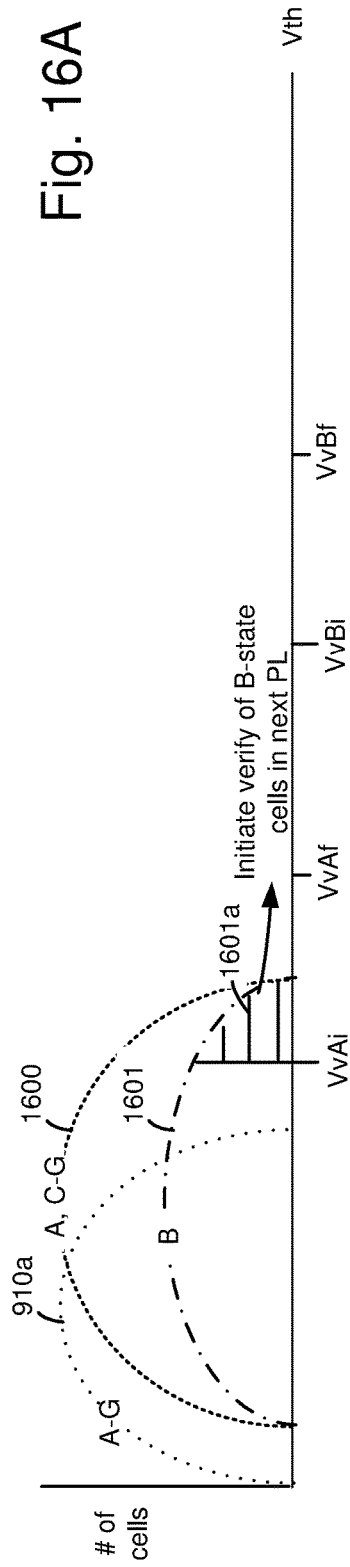
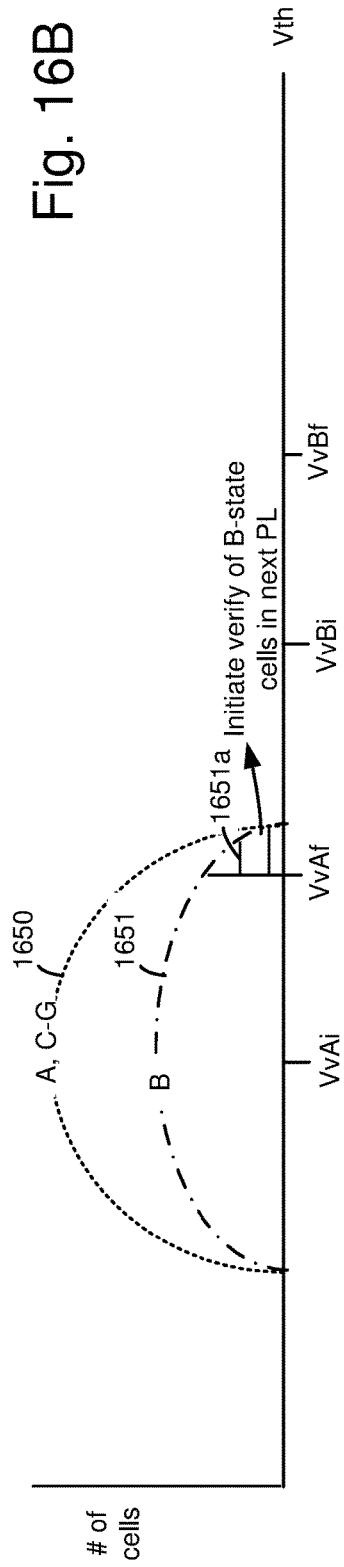
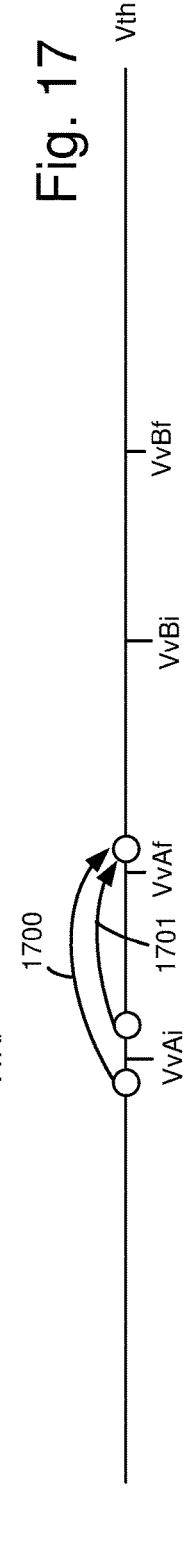
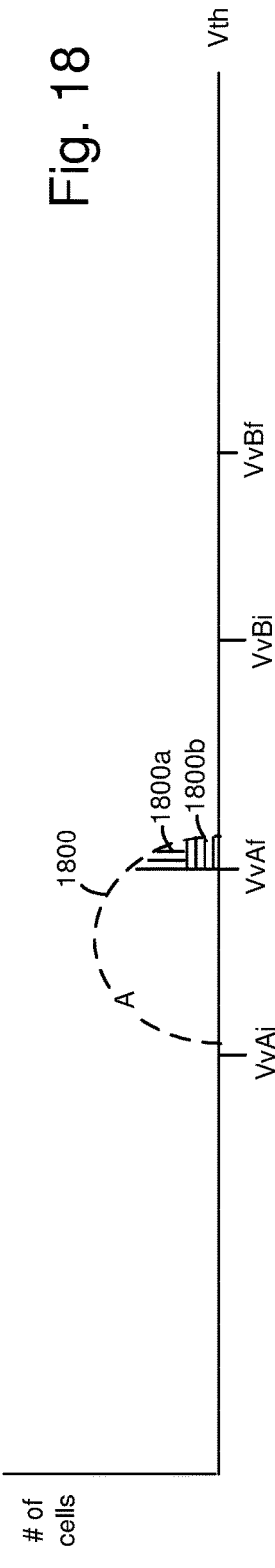

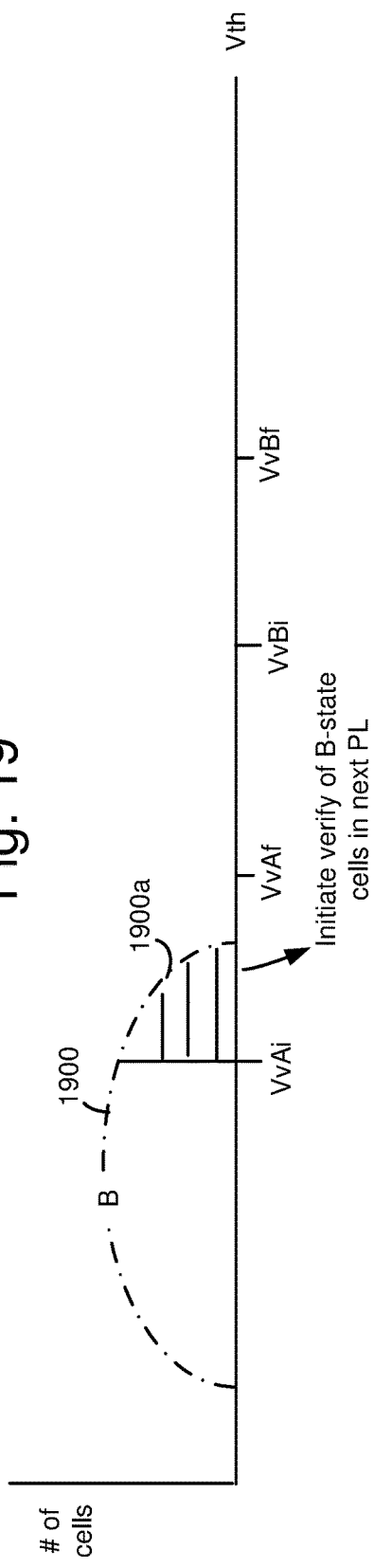

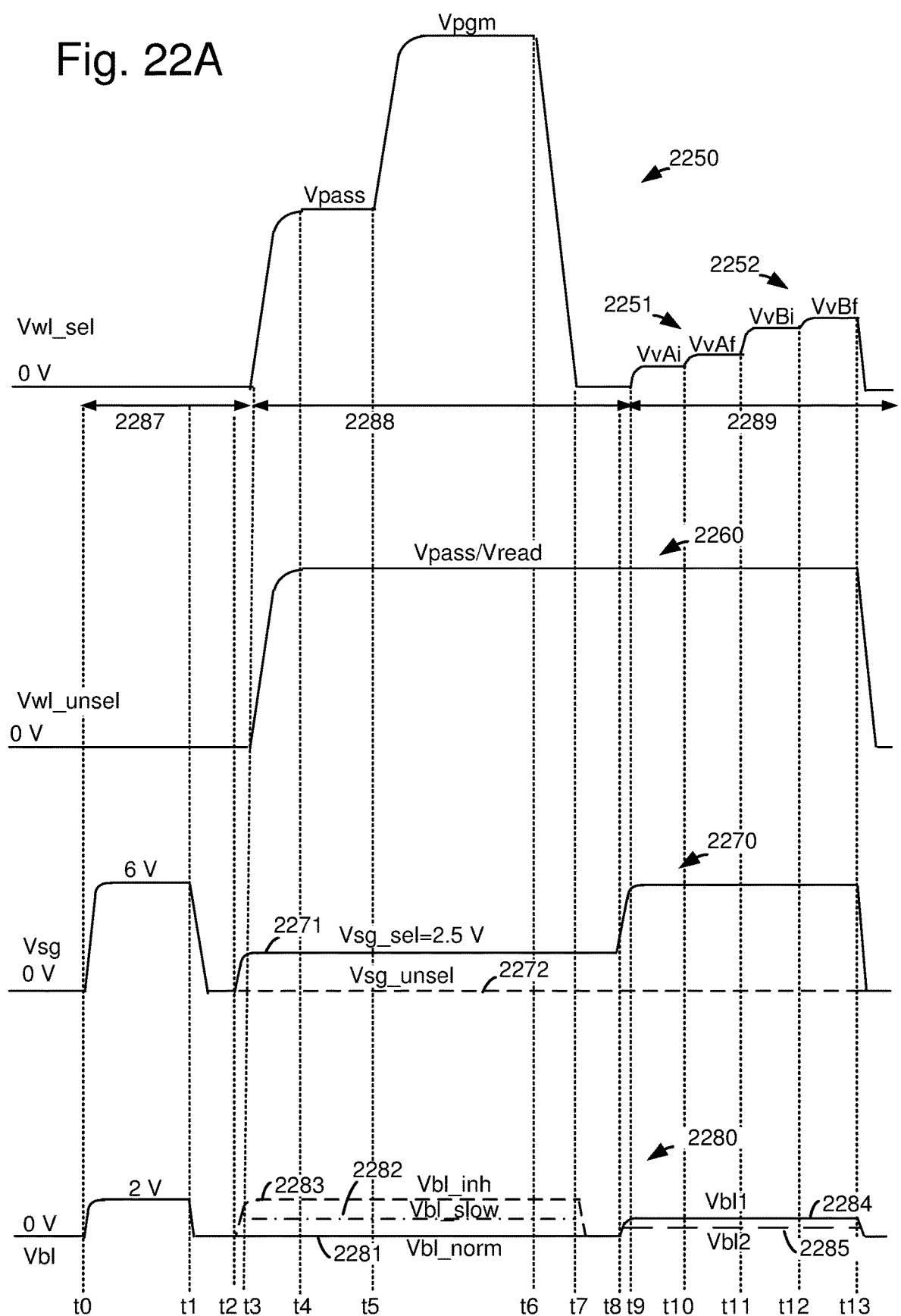

PROGRAMMING PROCESS COMBINING ADAPTIVE VERIFY WITH NORMAL AND SLOW PROGRAMMING SPEEDS IN A MEMORY DEVICE

CLAIM OF PRIORITY

This is a continuation application of U.S. patent application Ser. No. 16/189,200, filed Nov. 13, 2018, published as US 2020/0152282 on May 14, 2020 and issued as U.S. Pat. No. 10,910,075 on Feb. 2, 2021, titled "Programming Process Combining Adaptive Verify With Normal And Slow Programming Speeds In A Memory Device" and incorporated herein by reference.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance. However, various challenges are presented in operating such memory devices.

BRIEF DESCRIPTION OF THE DRAWINGS

FIG. 11 depicts an example of widened Vth distributions due to over-programming.

FIG. 12 depicts plots of Vth width versus an initial program voltage, Vpgm_init, for different program voltage step sizes.

FIG. 13A depicts an example programming process which combines an adaptive verify technique with normal and slow programming speeds.

FIG. 13C depicts an example process for implementing steps 1303, 1304, 1308 and 1309 of FIG. 13A, where the verification of memory cells assigned to a second data state with a verification signal of the first data state is used to initiate the verification of memory cells of the second data state with a verification signal of the second data state.

FIG. 13D depicts an example process for selecting option 1 or 2 in FIG. 13B or 13C as a function of a number of PE cycles.

FIG. 13E depicts a plot of a verify voltage for initiating the application of a verification signal as a function of a number of PE cycles, consistent with FIG. 13D.

FIG. 13F depicts a plot of a verify voltage for initiating the application of a verification signal as a function of a number of program loops used to complete a program operation, as an alternative to FIG. 13E.

FIG. 13G depicts a plot of a verify voltage for initiating the application of a verification signal as a function of a number of PE cycles, as an alternative to FIG. 13E, where sensing is performed using normal and reduced bit line voltages, Vbl1 and Vbl2, respectively.

FIG. 13H depicts an example process for sensing the memory cells assigned to the second data state in FIG. 13C, steps 1342 and 1344.

FIG. 14A-14F depict Vth distributions of memory cells in program loops 1-6, respectively, of an example program operation, where a verification of A-state memory cells at a final verify voltage VvAf, including A-state memory cells subject to a reduced programming speed, is used to initiate the verification of B-state memory cells in a subsequent program loop, resulting in over-programming of the B-state memory cells.

FIG. 15A-15F depict Vth distributions of memory cells in program loops 1-6, respectively, of an example program operation, where a verification of A-state memory cells at an initial verify voltage VvAi is used to initiate the verification of B-state memory cells in a subsequent program loop, consistent with FIG. 13B, step 1322.

FIG. 16A depicts Vth distributions of memory cells in program loop 1 of an example program operation, where a verification of B-state memory cells at an initial verify voltage VvAi is used to initiate the verification of B-state memory cells in a subsequent program loop, consistent with FIG. 13C, step 1342.

FIG. 16B depicts Vth distributions of memory cells in a program loop of an example program operation, where a verification of B-state memory cells at a final verify voltage VvAf is used to initiate the verification of B-state memory cells in a subsequent program loop, consistent with FIG. 13C, step 1344.

FIG. 17 depicts example increases in Vth for two memory cells in one program loop, where one memory cell has a Vth which increases from below VvAi to above VvAf (arrow 1700), and another memory cell has a Vth which increase from between VvAi and VvAf, to above VvAf (arrow 1701).

FIG. 18 depicts a Vth distribution 1800 which is an alternative to the Vth distribution 1404 of FIG. 14C, where regions 1800a and 1800b of the Vth distribution are consistent with the arrows 1700 and 1701, respectively, of FIG. 17, and where verification of A-state memory cells at a final verify voltage VvAf includes A-state memory cells subject to a normal programming speed but not a reduced programming speed, to initiate the verification of B-state memory cells in a subsequent program loop.

FIG. 19 depicts a Vth distribution 1900 which is upshifted relative to the Vth distribution 1601 of FIG. 16A, and which may be obtained by sensing using a reduced bit line voltage (Vbl2) instead of a normal bit line voltage (Vbl1), consistent with FIG. 13H.

FIG. 20 depicts example values in the latches of FIG. 2 during a program operation, consistent with FIG. 13B, steps 1321 and 1329 and FIG. 13C, step 1341 and 1349.

FIG. 21 depicts an example set of memory cells connected to a word line selected for programming, consistent with FIG. 13A, step 1300.

FIG. 22A depicts examples of voltage signals which can be used in a program loop of a program operation, consistent with FIG. 13A, steps 1301-1304.

DETAILED DESCRIPTION

Apparatuses and techniques are described for optimizing a program operation in a memory device, where the program operation combines an adaptive verify process with normal and slow programming speeds.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Figure 10A:
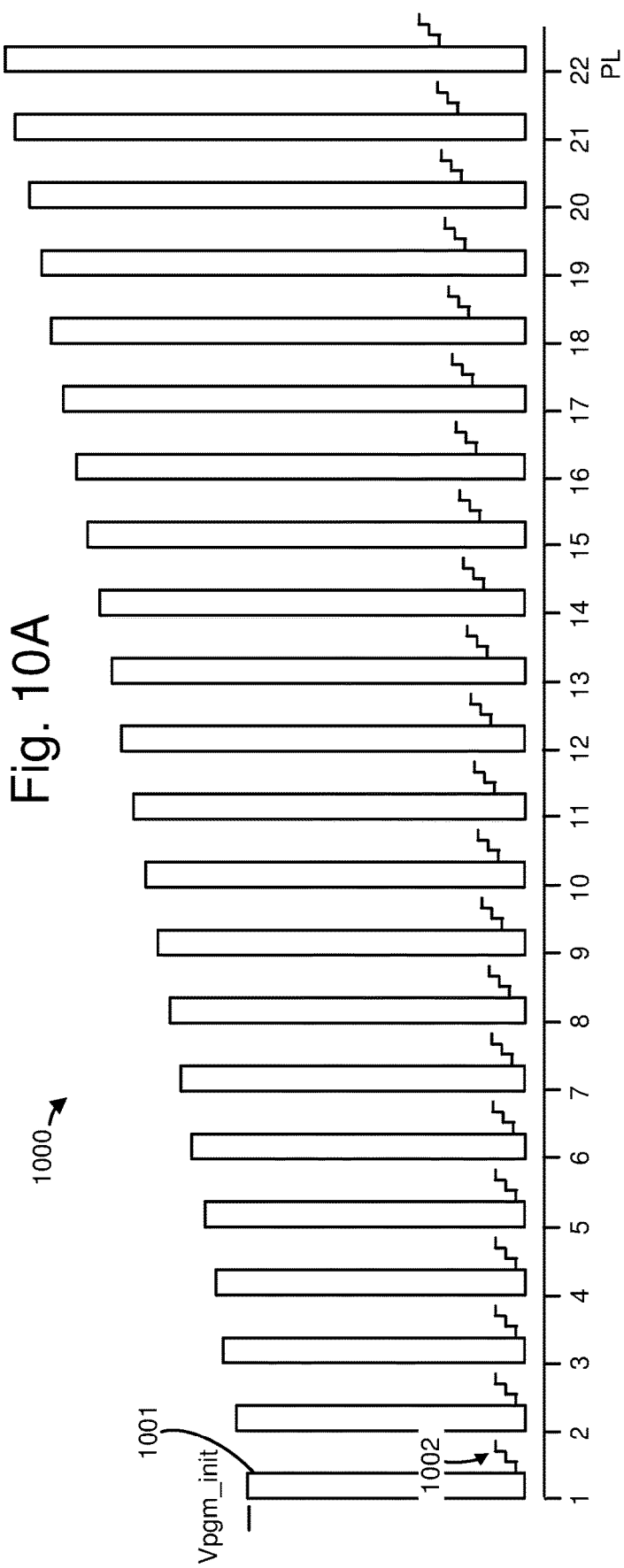
FIG. 10A depicts a voltage signal used in a series of program loops in an example program operation which results in the Vth distribution of FIG. 9.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10A. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command Based on its data state, a memory cell will either remain in the erased state or be programmed to a programmed data state (a data state higher than the erased state). MLC or multi-level cells store two or more bits per cell. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9). In a four-bit per cell memory device, there are sixteen data states including the erased state and fifteen higher data states.

In order to store data in a high density format, the threshold voltage distributions of the different data states should be as narrow as possible. One approach is to apply a different programming speed to each memory cell during program loops of a program operation. During a program loop, memory cells experiencing a particular programming speed are exposed to different biases to control how much, or how little, the program loop impacts the Vth of the memory cell. In particular embodiments, the solution programs a memory cell with a normal programming speed or a reduced programming speed (lower than the normal programming speed), or inhibits (prevents) programming A memory cell which is subject to the normal programming speed will have a larger increase in Vth with each program pulse compared to a memory cell which is subject to the slow programming speed.

To achieve a narrow threshold voltage distribution for memory cells of a particular target state, the program operation may implement a normal (fast) programming speed and then a reduced (slow) programming speed for the memory cells of one or more data states during the program operation and finally inhibit programming. The data in latches associated with a memory cell can be accessed to determine if the memory cell is subject to the normal or fast programming speed, or should be inhibited from programming, in a program loop. See FIG. 20.

With the normal programming speed, the bit line voltage (Vbl) is set at a low level Vbl_norm such as 0 V, a ground voltage, so that the gate-to-drain voltage across the memory cells is maximized at Vpgm-Vth, where Vpgm is the magnitude of the program voltage and Vth is the threshold voltage of the memory cell. The number of electrons injected into the charge-trapping layer of the memory cells, and the corresponding increase in threshold voltage (Vth), is also maximized, with the application of each program voltage. During the course of the program operation, when the Vth of a memory cell exceeds an initial verify voltage, the memory cell may be subject to the reduced programming speed in the next program loop.

With the reduced programming speed, Vbl is set at an elevated, positive voltage Vbl_slow, such as 0.5-1.0 V, so that the gate-to-drain voltage across the memory cells, Vpgm-Vth-Vbl, is reduced relative to the voltage during the normal programming speed. The corresponding increase in Vth is also reduced with the application of each program voltage.

When the Vth of a memory cell exceeds a final verify voltage, the memory cell is inhibited from programming in the remaining program loops. This prevents further changes in the Vth of the memory cell. To inhibit programming, Vbl is set at an elevated, positive voltage Vbl_inh such as 2 V which is sufficiently high to prevent further programming of a memory cell even when additional program voltages are applied to the word line to continue programming of other memory cells. Vbl during the reduced programming speed is not sufficiently high to prevent further programming, and Vbl_norm<Vbl_slow<Vbl_inh. See FIG. 9 for examples of initial and final verify voltages of each programmed data state.

In one embodiment, the normal programming speed is implemented by applying Vbl=0 V, which is lower than the control gate voltage of the SGD transistor minus the Vth of the SGD transistor (e.g., Vbl=0 V<Vsgd-Vth). This places the SGD transistor in a conductive state during the application of the program voltage, so that the bit line drives a channel of a NAND string at 0 V. The gate-to-channel voltage of the selected memory cell is maximized and the greatest amount of programming occurs.

In one embodiment, the reduced programming speed is implemented by applying a Vbl which is greater than 0 V and lower than the control gate voltage of the SGD transistor minus the Vth of the SGD transistor (e.g., 0<Vbl<Vsgd-Vth). This places the SGD transistor in a conductive state during the application of the program voltage, so that the bit line drives the channel at a positive voltage. The gate-to-channel voltage of the selected memory cell is reduced compared to the normal programming speed but is still relatively high so that a significant amount of programming occurs.

In one embodiment, programming is inhibited by applying a Vbl which is greater than the control gate voltage of the SGD transistor minus the Vth of the SGD transistor (e.g., Vbl>Vsgd-Vth). This places the SGD transistor in a non-conductive state during the application of the program voltage so that the bit line does not drive the channel. For example, Vbl may be equal to the control gate voltage of the SGD transistor. When the SGD transistor is in a non-conductive state, the channel voltage floats and be coupled higher by the increase in the word line voltages to Vpass and Vpgm. The gate-to-channel voltage of the unselected memory cells is minimized so that programming is prevented in the unselected NAND strings.

Another approach to optimizing programming is to minimize the number of verify operations using an adaptive verify process. Verify operations are performed in each program loop after the application of the program voltage to determine if the Vth of the memory cells exceeds an initial or final verify voltage. However, verify operations can be performed for only a subset of all of the data states in a given program loop based on the knowledge that memory cells assigned to lower or higher data states will complete programming relatively sooner or later, respectively, in the program operation.

Figure 10B:
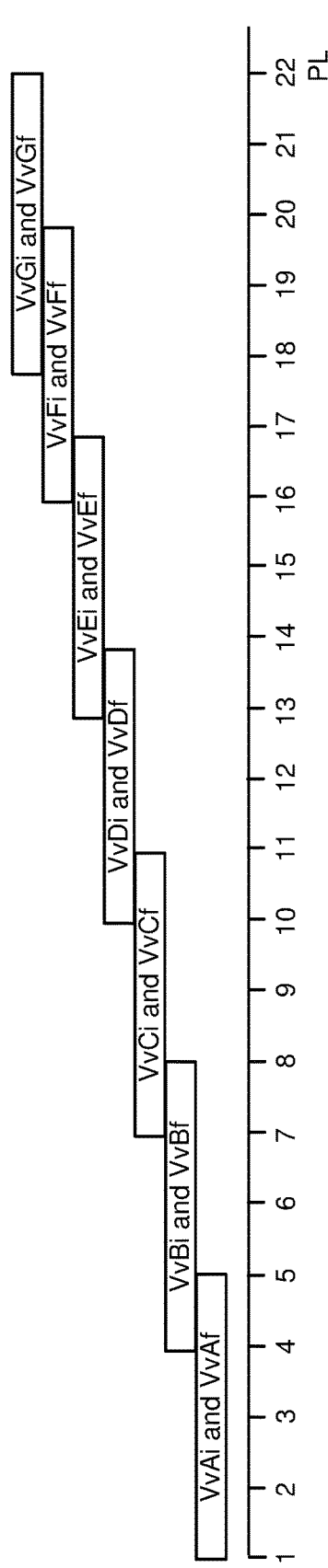
FIG. 10B depicts an example of the verification of different data states in the different program loops of FIG. 10A.

For example, FIG. 10B shows a progression of verify operations starting from the lowest programmed state, the A-state, and concluding with the highest programmed data state, the G state, assuming eight data states are used. Additionally, an adaptive verify process can be used to determine when to begin the verify operations for each data state after the A-state. Typically, the A-state verify operations begin in the first program loop. In the adaptive verify process, the verify operations for memory cells assigned to a given data state are initiated in a program loop based on the program progress of memory cells assigned to a lower data state in a prior program loop. For example, the program progress of A-state memory cells can be used to initiate verify operations for B-state memory cells. By minimizing the number of verify operations, the overall time of the program operation can be reduced.

However, when the adaptive verify process is used with the slow programming, the verify operations may not be initiated at an optimal time. In particular, the verify operations for memory cells assigned to a given data state may not be implemented sufficiently soon in the program operation when the program progress of a lower state is based on when the Vth of memory cells subject to the reduced programming speed exceeds a final verify voltage. This is due to the additional program loops used when the memory cells of the lower state are subject to the reduced programming speed. Over-programming can occur for the memory cells of the given data state, as depicted in FIG. 11. Moreover, over-programming of one data state can propagate to the remaining, higher data states as well. The over-programming results in a widened Vth distribution and a higher upper tail of the Vth distribution.

Additionally, over-programming can be caused by additional factors such as changes to program settings, such as the initial program voltage and the step size of the program voltage, performance variations between different groups of memory cells, such as different word lines, block or die due to fabrication non-uniformities, and performance variations over time. Regarding performance variations over time, the gate oxide of the memory cells can degrade with an increasing number of program-erase (PE) cycles, resulting in a larger Vth increase with the application of each program voltage. Some of these factors are random or hard to predict.

Due to the above factors, selecting an optimal time to initiate verify operations in an adaptive verify process can be problematic.

Techniques provided herein address the above and other issues. In one aspect, verify operations are initiated for memory cells assigned to a second data state based on the program progress of memory cells assigned to a lower, first data state relative to an initial verify voltage of the first data state. Typically, the memory cells assigned to the first data state will be subject to the normal programming speed during these verify operations so that the decision to initiate the verify operations for the second data state is not delayed.

The first and second data states can be any programmed data states. In one approach, the second data state has a final verify voltage which is higher than a final verify voltage of the first data state. The second data state can be one or more data states above the first data state in a sequence of data states such as in FIG. 9. For example, verify operations can be initiated for memory cells assigned to the B-state based on the program progress of memory cells assigned to the A-state relative to VvAi. See FIG. 15A-15F.

In another aspect, verify operations are initiated for memory cells assigned to a second data state based on the program progress of memory cells assigned to a first data state relative to a final verify voltage of the first data state. Moreover, the program progress considers memory cells assigned to the first data state and subject to the normal programming speed in the current program loop while excluding memory cells assigned to the first data state and subject to the reduced programming speed in the current program loop. Typically, some portion of the memory cells assigned to the first data state will be subject to the normal programming speed during these verify operations so that the decision to initiate the verify operations for the second data state is not delayed. See FIG. 17. For example, verify operations can be initiated for memory cells assigned to the B-state based on the program progress of memory cells assigned to the A-state relative to VvAf. See FIG. 18.

In another aspect, verify operations are initiated for memory cells assigned to a second data state based on the program progress of memory cells assigned to the second data state relative to an initial or final verify voltage of a first data state. See FIGS. 16A and 16B, respectively. For example, verify operations can be initiated for memory cells assigned to the B-state based on the program progress of memory cells assigned to the B-state relative to VvAi or VvAf. The memory cells assigned to the second data state will be subject to the normal programming speed during these verify operations so that the decision to initiate the verify operations for the second data state is not delayed.

In another aspect, the program progress relative to the initial or final verify voltage can be used when the memory cells have a relatively high or low number of PE cycles, respectively. See FIG. 13E. A number of program loops used to complete a program operation could also be used as depicted in FIG. 13F, since number of program loops used to complete a program operation tends to decrease as the number of PE cycles increases. The verify voltage which is used to trigger verify operations for a higher data state can therefore be adjusted over time as the performance of the memory device changes and/or adjusted for different memory devices. In one approach, the verify voltage which is used to trigger a verify operation is reduced over time.

In the above approaches, a count can be obtained of memory cells subject to the normal programming speed, and not subject to the reduced programming speed in the current program loop, to determine whether to initiate verify operations. If the count exceeds a threshold, the verify operations are initiated in a subsequent program loop. This avoids a delay which would otherwise occur if the count was based on memory cells subject to the reduced programming speed.

In another aspect, when verify operations are initiated for memory cells assigned to a second data state based on the program progress of memory cells assigned to the second data state relative to a verify voltage of a first data state, a power-saving sensing can be used for the memory cells assigned to the second data state. The sensing of the memory cells assigned to the second data state in this situation can have a reduced accuracy since it is sufficient to obtain a rough idea of their program progress. In one approach, sense circuits are configured to charge bit lines connected to the memory cells configured to store data in the first data state to a first bit line voltage (e.g., Vbl1=0.5 V) and to charge bit lines connected to the memory cells configured to store data in the second data state to a second bit line voltage (e.g., Vbl2=0.3 V), lower than the first bit line voltage. See FIGS. 13H and 22A.

These and other features are discussed further below.

Figure 1:
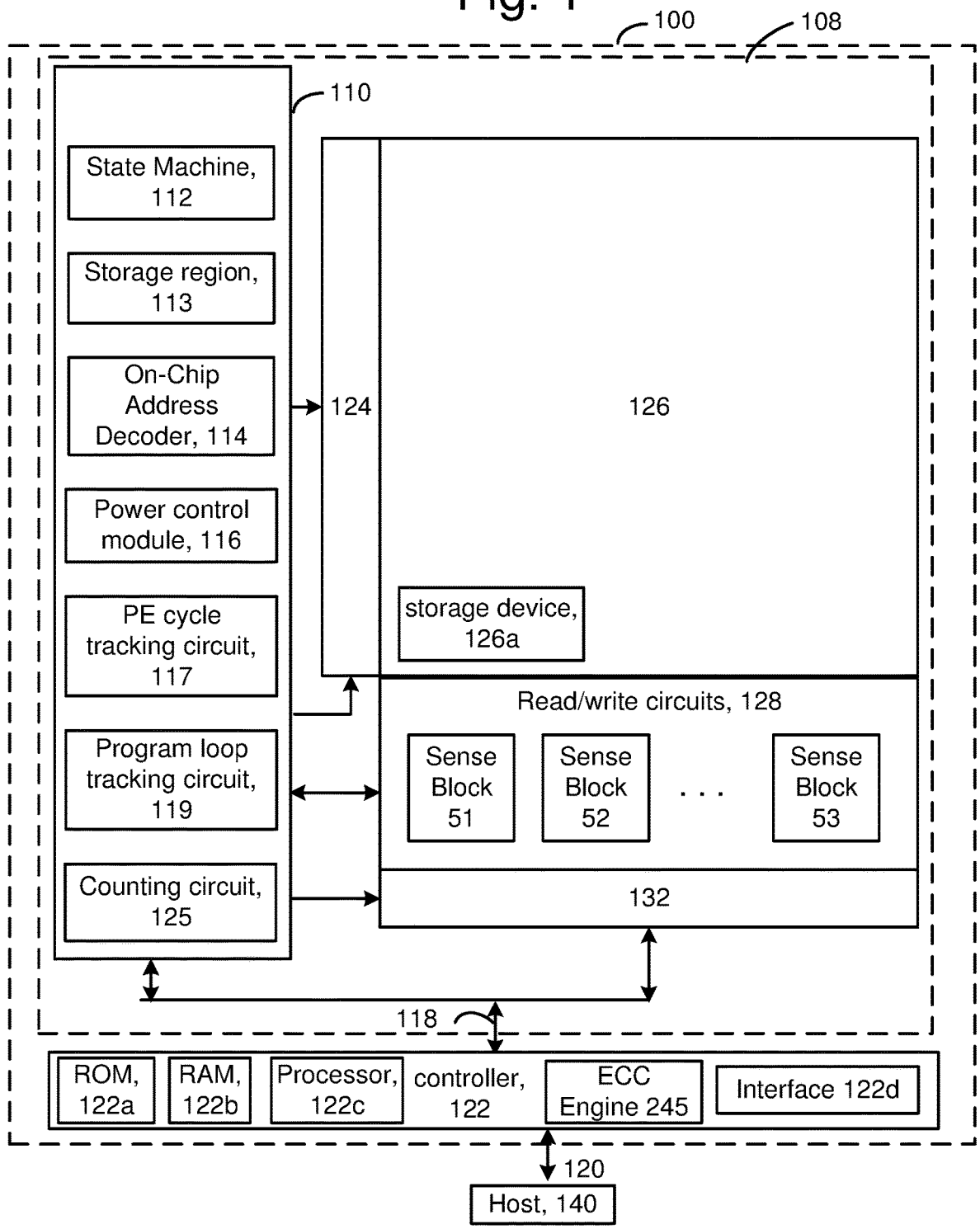
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit), a PE cycle tracking circuit 117, a program loop tracking circuit 119 and a counting circuit 125. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The PE cycle tracking circuit 117 can track a number of PE cycles which are accumulated over time by a memory device, block or other set of memory cells for use, e.g., as discussed in connection with FIG. 13E. The program loop tracking circuit 119 can detect a number of program loops used to complete a program operation for use, e.g., as discussed in connection with FIG. 13F. The counting circuit 125 can count a number of memory cells which are in a non-conductive state, for instance, during a verify operation. The counting circuit can be configured with hardware, firmware and/or software for implementing the techniques described herein. The counting circuit can count the number of memory cells which are in a non-conductive state, for instance, and compare the number to a threshold of a success criterion, such as 1% of the memory cells of a given assigned data state or 1% of all memory cells connected to a word line. A bit scan circuit is an example of a counting circuit. A bit such as in the trip latch 174 of FIG. 2 can be stored for each memory cell being sensed. The counting circuit can count the number of bits in the trip latches which denote the non-conductive state, in one possible approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit such as a programming circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the techniques described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
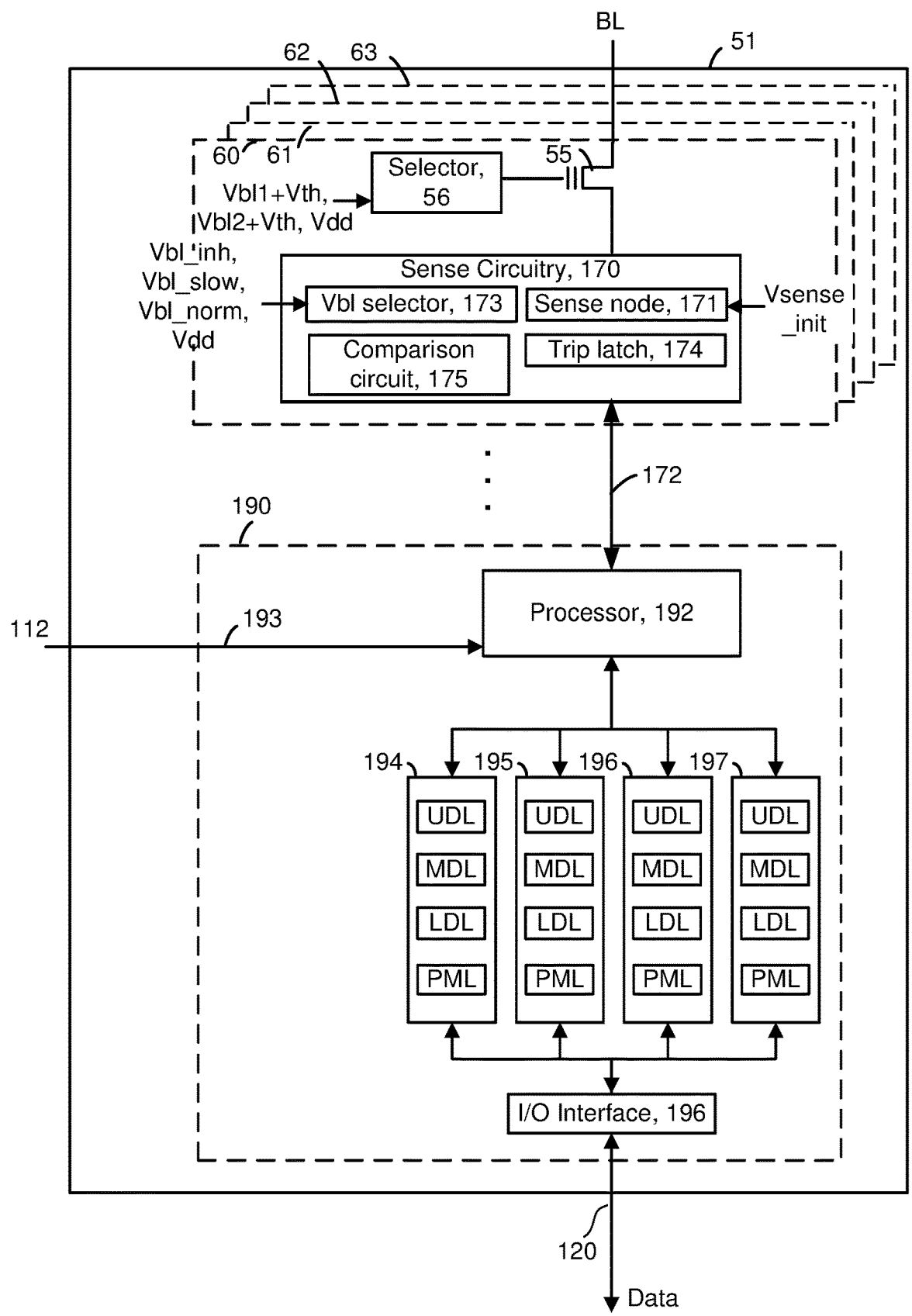
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programming, Vbl_slow (e.g., 0.5-1.0 V) to a bit line connected to a memory cell subject to the reduced programming speed, or Vbl_norm (e.g., 0 V) to a bit line connected to a memory cell subject to the normal programming speed. A transistor 55 (e.g., an nMOS) can be configured as a pass gate during the application of a program voltage to pass Vbl from the Vbl selector, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as verify operations which occur during the application of a verification signal, the bit line voltage is set by the transistor 55 based on the voltage passed by the selector 56. The bit line voltage is roughly equal to the control gate voltage of the transistor minus its Vth (e.g., 1 V). For example, if Vbl1+Vth or Vbl2+Vth is passed by the selector 56, the bit line voltage will be Vbl1 (a first voltage) or Vbl2 (a second voltage), respectively. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower. During sensing, the transistor 55 thus charges up the bit line. A higher bit line voltage Vbl1 (e.g., 0.5 V) may be used for memory cells where sensing accuracy is most important. These are the memory cells which are sensed using a verification signal of their assigned data state. For example, this could be memory cells which are assigned to the A-state and which are sensed while VvAi or VvAf is applied to the selected word line. A lower bit line voltage Vbl2 (e.g., 0.3 V) may be used for memory cells where sensing accuracy is less important. For example, this could be memory cells which are assigned to the B-state and which are sensed while VvAi or VvAf is applied to the selected word line.

In one approach, the selector 56 of each sense circuit can be controlled separately from the selectors of other sense circuits, to pass Vbl1 or Vbl2. The Vbl selector 173 of each sense circuit can also be controlled separately from the Vbl selectors of other sense circuits During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. See FIG. 22C. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches PML, LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device. One additional data latch per bit line can be provided for each additional data bit per memory cell. PML stores a bit indicating whether the associated memory cell is subject to the reduced programming speed.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, comprises a series of programming voltage pulses applied to the control gates of the addressed memory cells. See FIG. 10A. Each program voltage is followed by a verify operation to determine if the memory cells have been programmed to the desired memory state. In some cases, processor 192 monitors the read back memory state relative to the desired memory state. When the two are in agreement, the processor 192 sets the bit line to inhibit programming such as by updating its latches. See FIG. 20. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
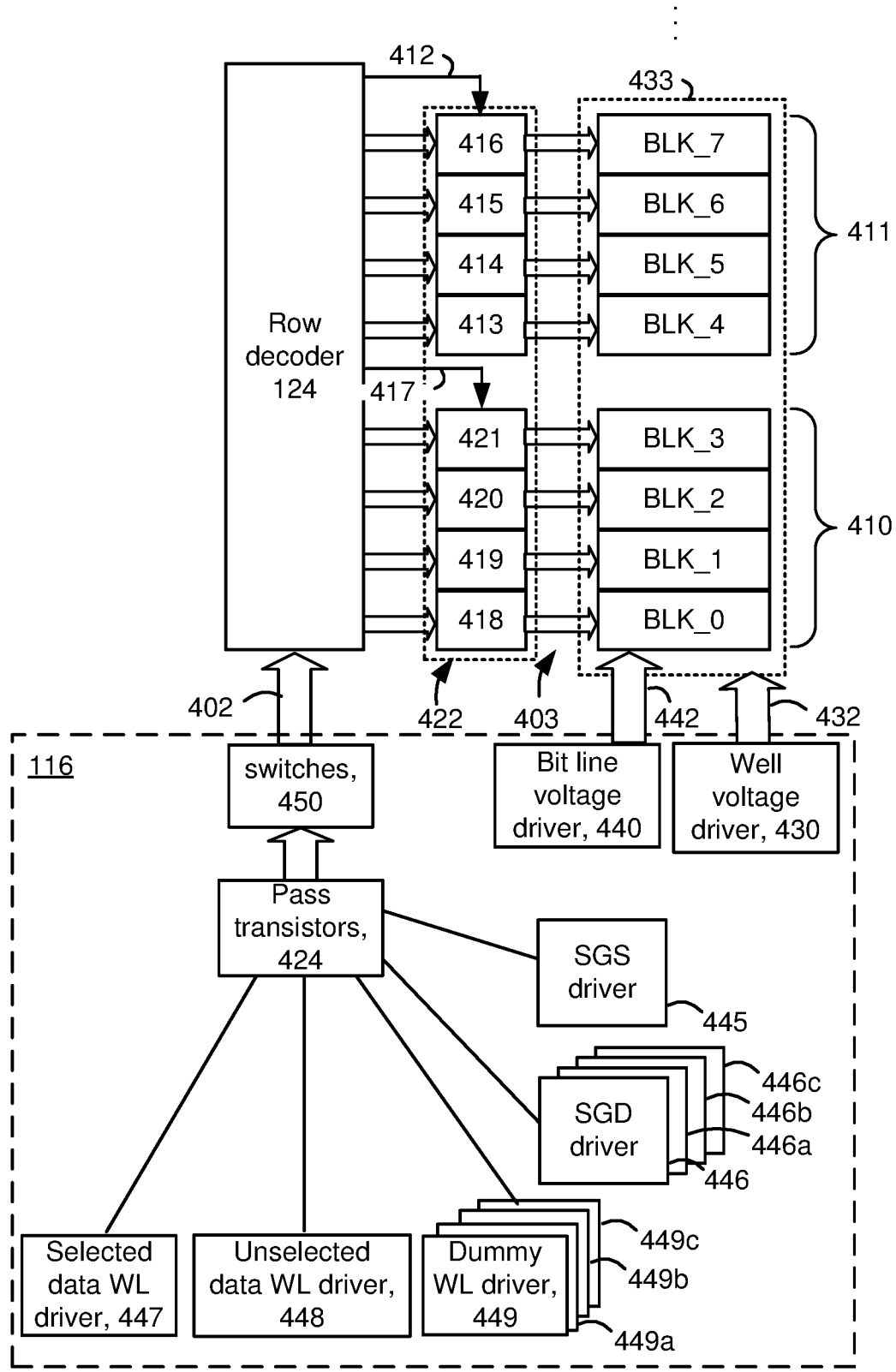
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation, a driver 448 for unselected data word lines, and dummy word line drivers 449-449c which provide voltages on dummy word lines. For example, the dummy word line drivers 449, 449a, 449b and 449c may provide voltages on the control gate layers or word line layers WLDD0, WLDD1, WLDS1 and WLDS0, respectively, in FIG. 5A, during a refresh operation as described herein.

Figure 7:
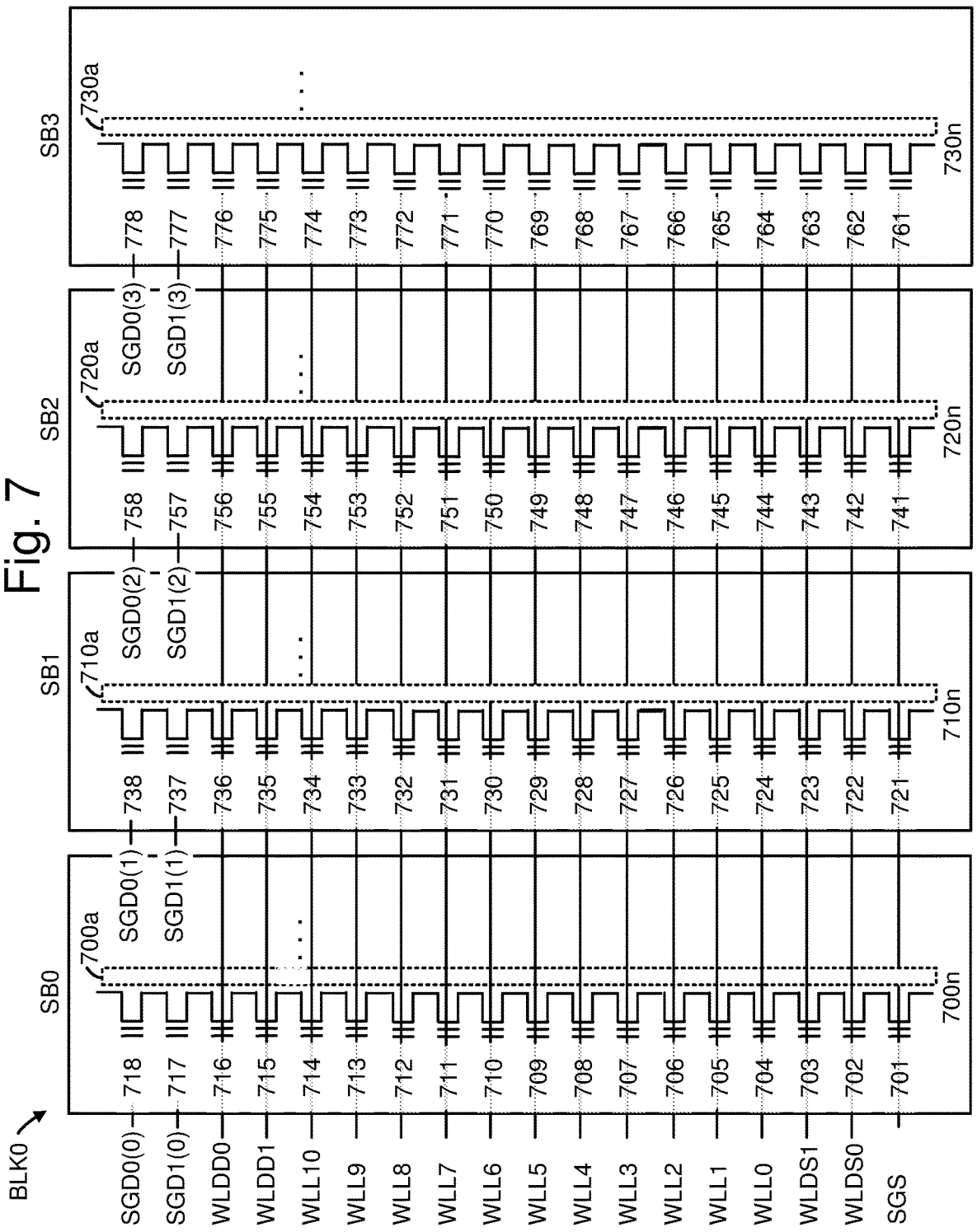
FIG. 7 depicts an example view of NAND strings in a block BLK0 which is consistent with FIGS. 4 and 5A.
Figure 8A:
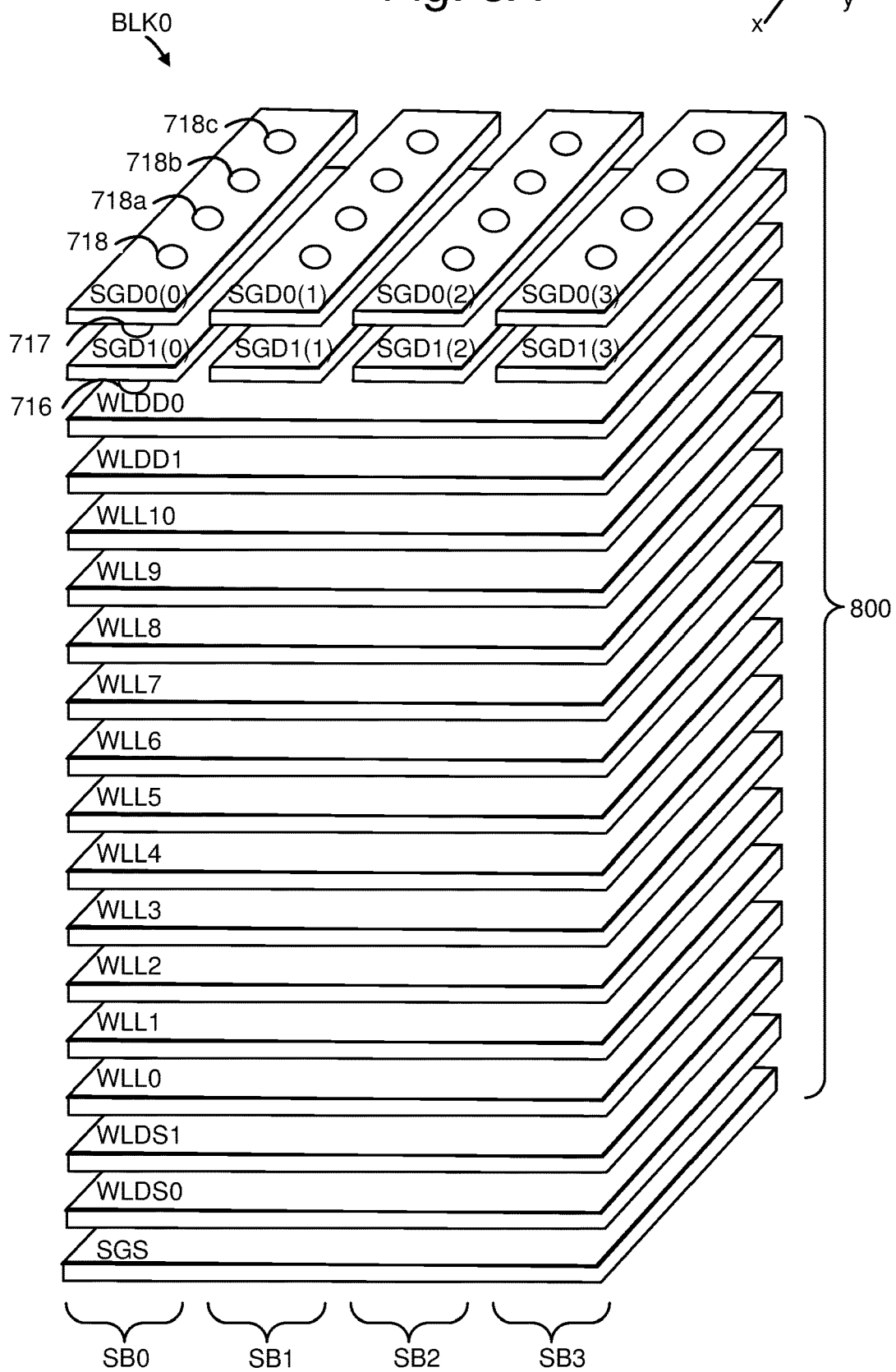
FIG. 8A depicts control gate layers in the block BLK0, consistent with FIG. 7.
Figure 8B:
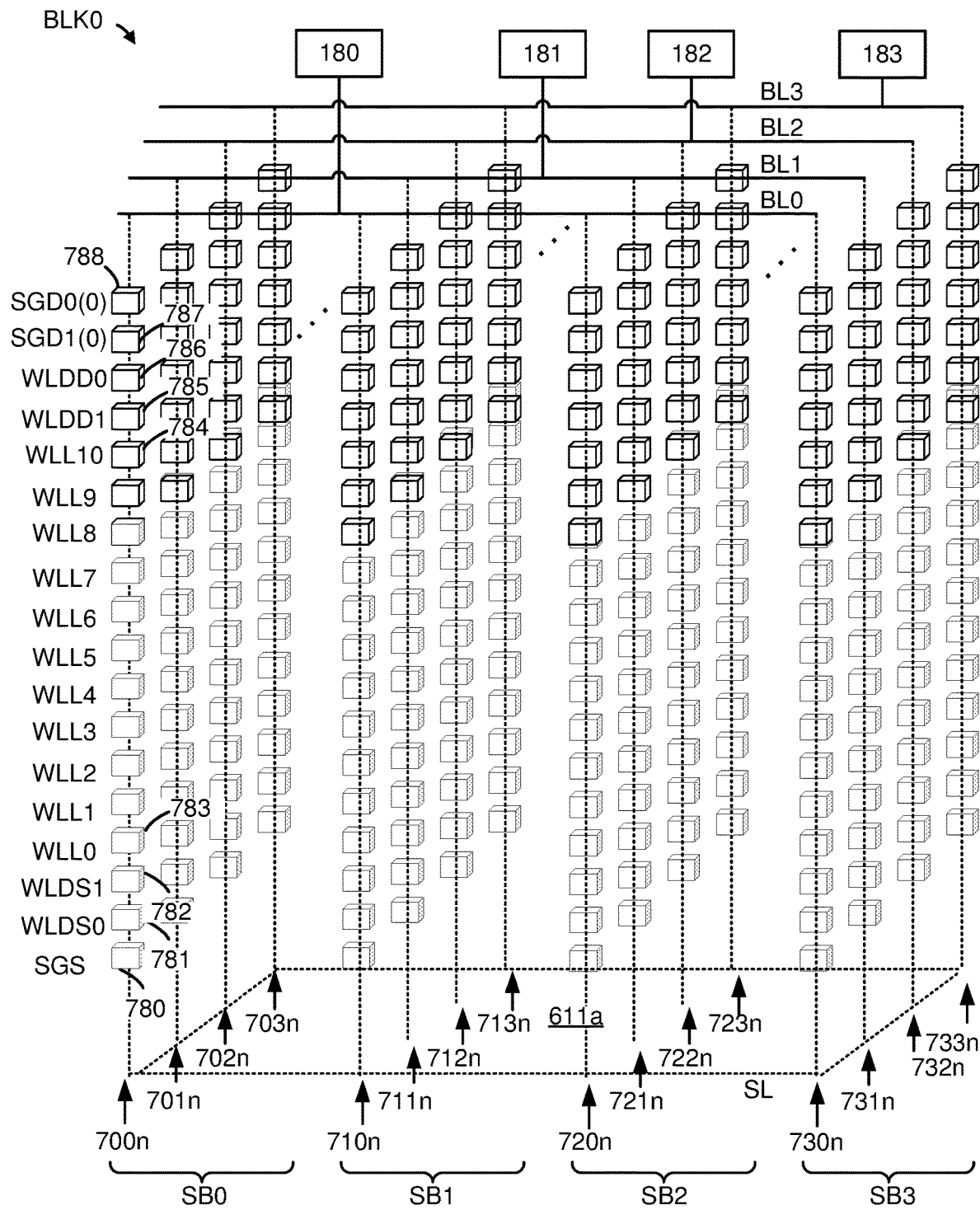
FIG. 8B depicts additional detail of the block BLK0 of FIG. 7.

The voltage drivers can also include an SGS driver 445 for a block, and separate SGD drivers 446, 446a, 446b and 446c for SB0, SB1, SB2 and SB3, respectively, such as in FIGS. 7, 8A and 8B. Moreover, in some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach.

The various components, including the row decoder, may receive commands from a controller such as the state machine 112 or the controller 122 to perform the functions described herein.

In one approach, the well region 433 is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
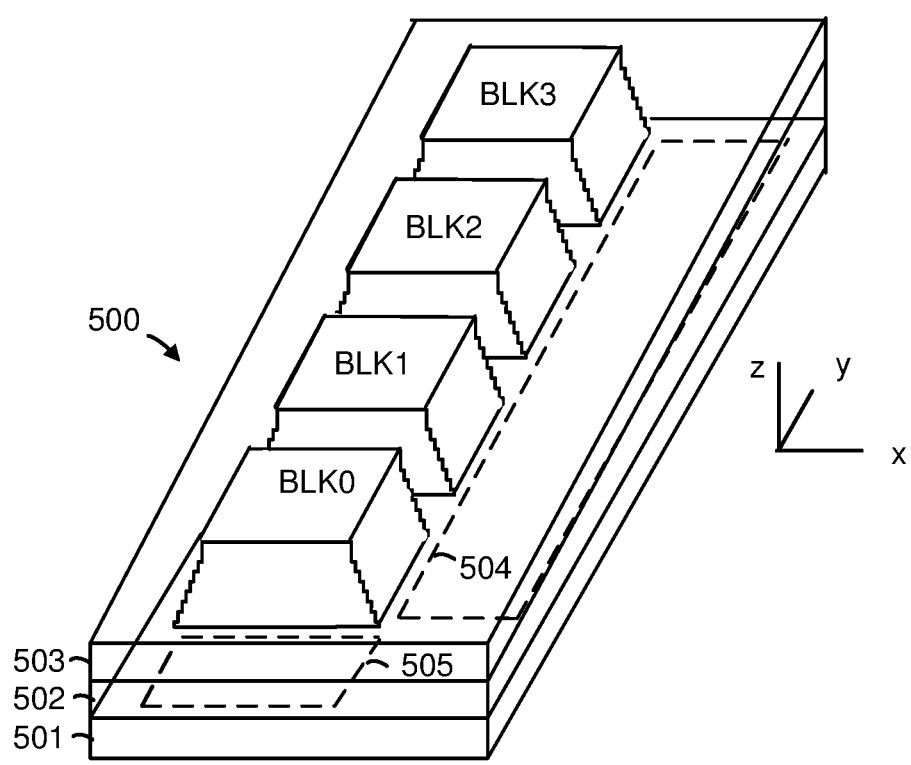
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5A:
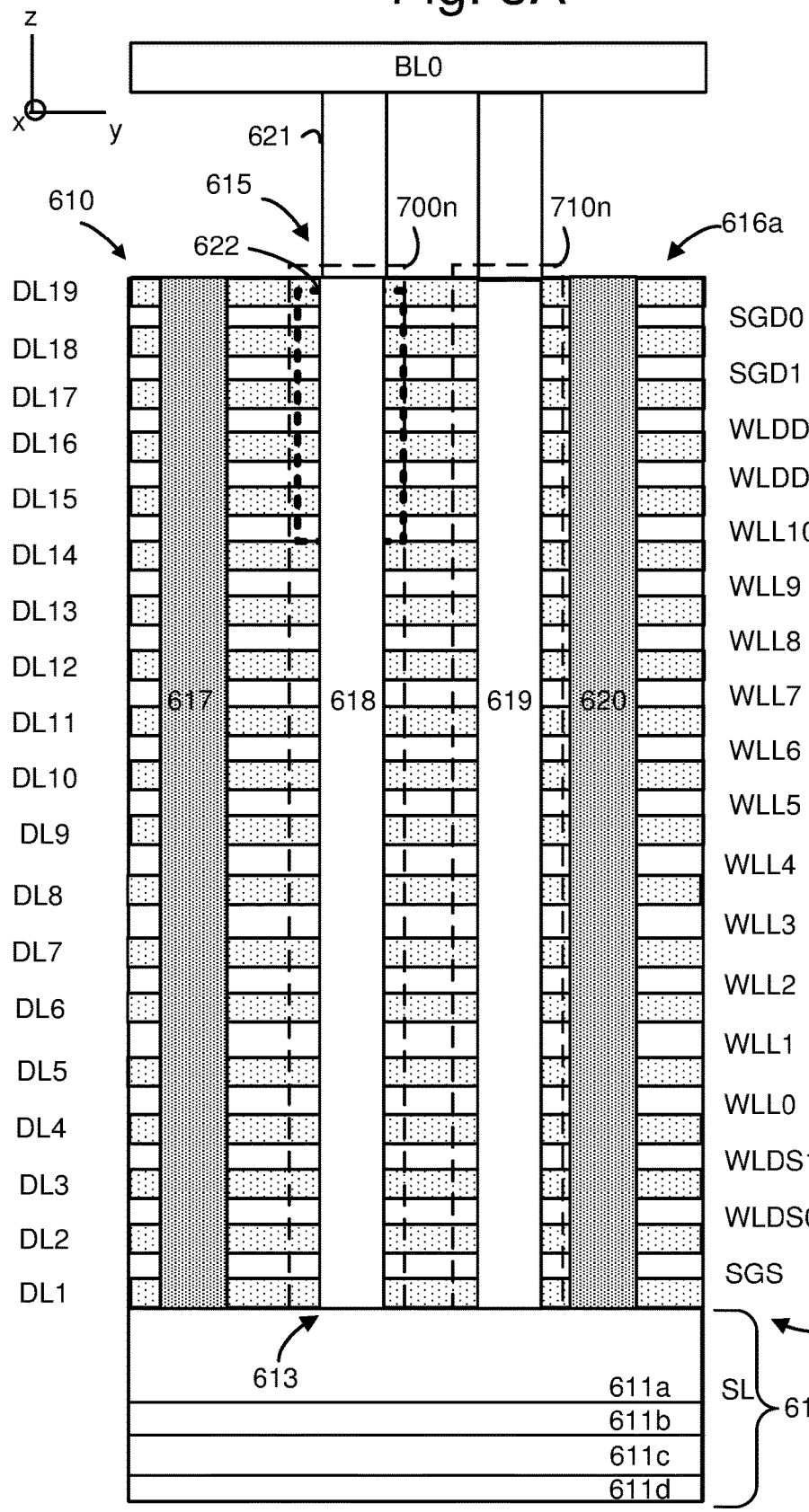
FIG. 5A depicts an example cross-sectional view of a portion of the block BLK0 of FIG. 4.

FIG. 5A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700n and 710n are depicted. Each NAND string encompasses a memory hole 618 or 619 which is filled with materials which form memory cells adjacent to the word lines. Region 622 of the stack is shown in greater detail in FIG. 6.

The stack includes a substrate 611. In one approach, a portion of the source line SL comprises a well region 611a as an n-type source diffusion layer or well in the substrate. The well region is in contact with a source end of each string of memory cells in a block. An erase pulse may be applied to this layer in an erase operation The n-type well region 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NAND string 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 5B:
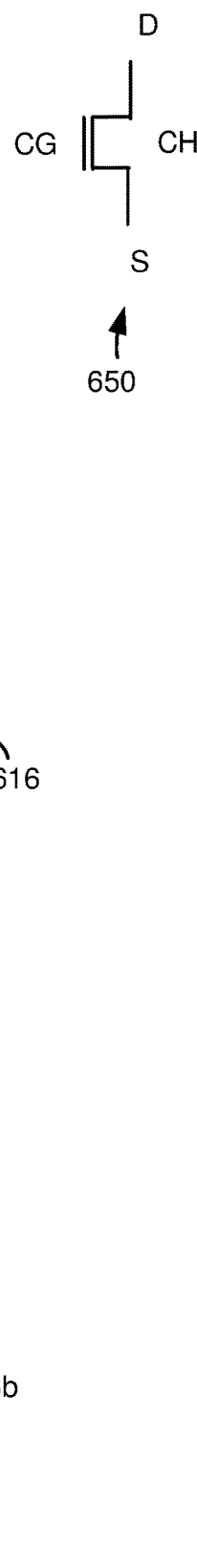
FIG. 5B depicts an example transistor 650 in BLK0.

FIG. 5B depicts an example transistor 650 in BLK0. The transistor comprises a control gate CG, a drain D, a source S and a channel CH and may represent a memory cell or a select gate transistor, for example.

Figure 6:
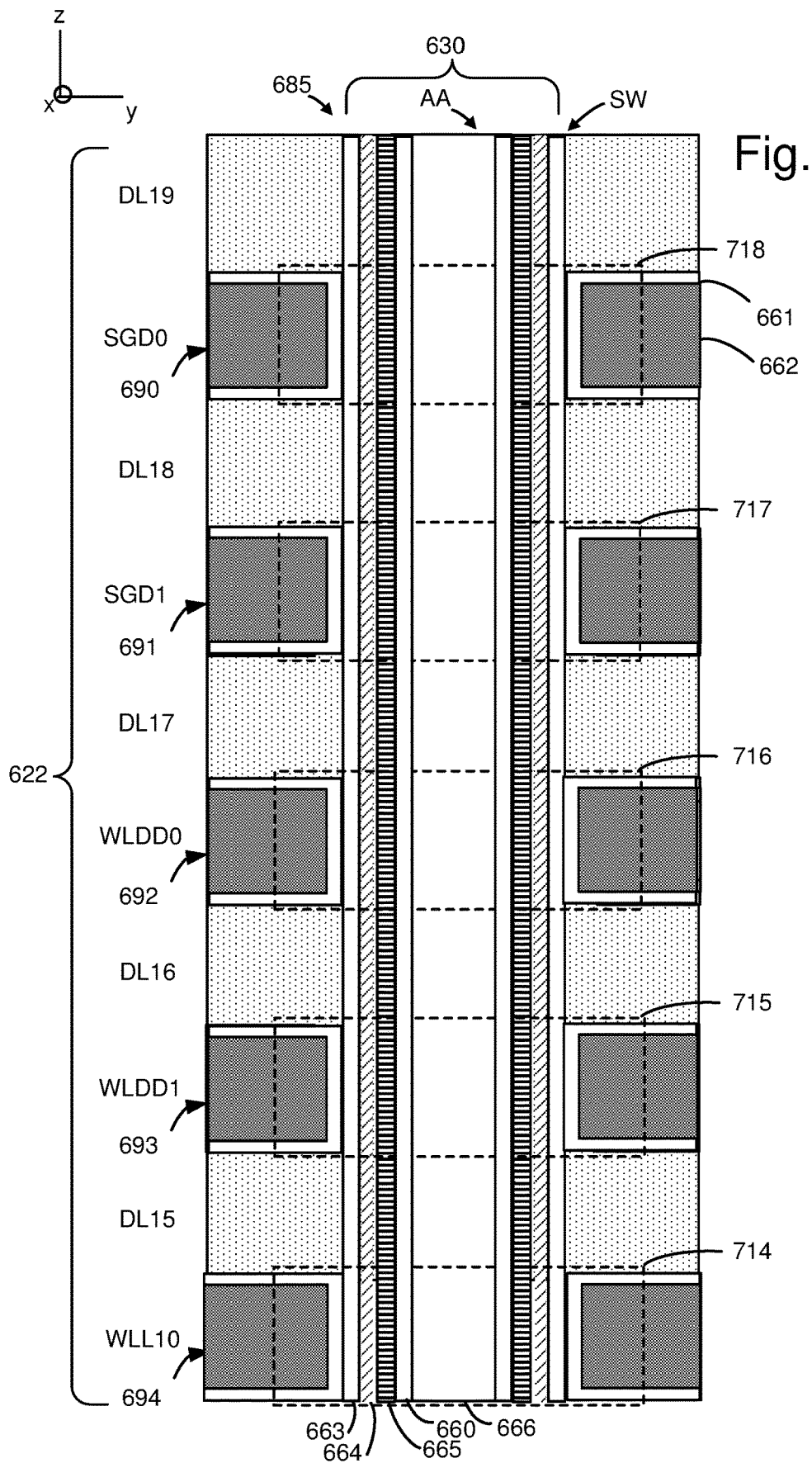
FIG. 6 depicts a close-up view of the region 622 of the stack of FIG. 5A.

FIG. 6 depicts a close-up view of the region 622 of the stack of FIG. 5A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride ($Si_3N_4$) or other nitride, a tunneling layer 665 (e.g., comprising a gate oxide which may degrade over time), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively. The channel 700a extends continuously in the NAND strings 700n from the SGS transistor 701 to the SGD transistors 717 and 718. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in the block BLK0 which is consistent with FIGS. 4 and 5A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 5A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1)

and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may connected to one another and commonly driven. In another approach, the SGS transistors are driven by separate control lines.

FIG. 8A depicts control gate layers in the block BLK0, consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks SB0-SB3. The control gate layers include a common SGS control gate layer for the block, and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

FIG. 8B depicts additional detail of the block BLK0 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or source line. For example, a set of memory cells, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells, which includes an example memory cell 734, is connected to WLL10 in SB1.

In this example, the source line SL or source region (well region 611a) is driven at a voltage Vsource.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven.

The NAND string 700n includes SGD transistors 788 and 787 connected to select gate lines SGD0(0) and SGD1(0), respectively, dummy memory cells 786 and 785 connected to WLDD0 and WLDD1, respectively, and data memory cell 784 connected to WLL10. The NAND string 700n also includes an SGS transistor 780 connected to a select gate line SGS, dummy memory cells 781 and 782 connected to WLDS0 and WLDS1, respectively, and data memory cell 783 connected to WLL0.

Figure 9:
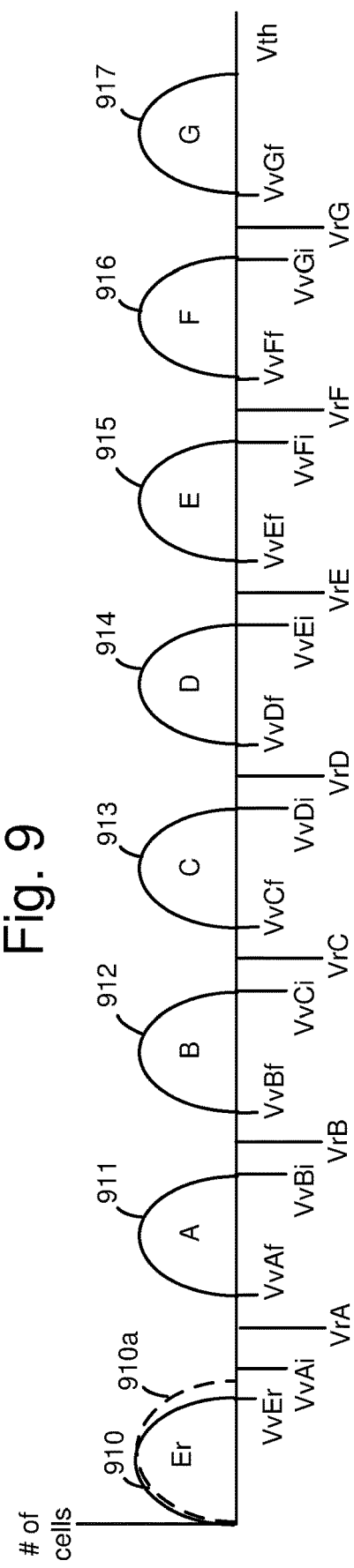
FIG. 9 depicts an example threshold voltage (Vth) distribution of a set of memory cells in eight data states.

FIG. 9 depicts an example Vth distribution of a set of memory cells in eight data states. In one approach, at a start of a program operation, the memory cells are all initially in the erased state as represented by the Vth distribution 910. After the program operation is successfully completed, the memory cells assigned to the Er state are represented by the Vth distribution 910a. The Vth distribution of the Er state is upshifted due to program disturb.

The memory cells which are programmed to the A, B, C, D, E, F and G states using the final verify voltages of VvAf, VvBf, VvCf, VvDf, VvEf, VvFf and VvGf, respectively, are represented by the Vth distributions 911, 912, 913, 914, 915, 916 and 917, respectively. The verify voltages are used in the verify operations or tests of the memory cells. Additionally, initial verify voltages VvAi, VvBi, VvCi, VvDi, VvEi, VvFi and VvGi may be used to trigger a reduced programming speed for the memory cells assigned to the A, B, C, D, E, F and G states, respectively. In this example, for a given data state, the initial verify voltage is less than the final verify voltage. The verify voltages are applied to a selected word line in a program operation.

Read voltages VrA, VrB, VrC, VrD, VrE, VrF and VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied.

FIG. 10A depicts a voltage signal used in a series of program loops in an example program operation which results in the Vth distribution of FIG. 9. During a program operation, program loops are performed for a selected word line in a selected block. A program loop comprises a program portion in which a program voltage or pulse is applied to the selected word line followed by a verify portion in which one or more verification signals are applied to the selected word line. During the application of the verification signals, verify operations, also referred to as verify tests, are performed for the associated memory cells.

The voltage signal 1000 includes a series of program voltages, including an initial program voltage 1001, which are applied to a word line selected for programming In this example, the voltage signal includes program voltages which increase stepwise in amplitude in one or more program loops of a programming pass using a fixed or varying step size. This is referred to as incremental step pulse programming, where the program voltage starts at an initial level, Vpgm_int, and increases in a step in each successive program loop, for instance, until the program operation is completed. The operation is successfully completed when the threshold voltages of the selected memory cells reach the final verify voltages of the assigned data states.

A program operation can include a single programming pass or multiple programming passes, where each pass uses incremental step pulse programming, for instance.

The verification signals in each program loop, including example verification signals 1002, can include initial and final verify voltages of the assigned data states which are being verified for the program loop. The verify tests can encompass lower assigned data states and then midrange assigned data states and then higher assigned data states as the program operations proceeds, as depicted in FIG. 10B. The example verification signals depict three verify voltages as a simplification. As used herein, a verification signal comprises a signal is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge the programming progress of a memory cell. A verification signal can include an initial verify voltage which is used to judge whether the Vth of a memory cell exceeds a voltage which is below a final verify voltage. The result of this sensing of the Vth relative to an initial verify voltage can be used to trigger a reduced programming speed for a memory cell. The verification signal can also include a final verify voltage which is used to judge whether the memory cell has completed programming to an assigned data state. The result of sensing of the Vth relative to a final verify voltage can be used to inhibit further programming of a memory cell. A goal is to use a verification signal to program the Vth of the memory cells assigned to a data state to a voltage which is slightly higher than the final verify voltage, such as depicted in FIG. 9, so that these memory cells have a narrow Vth distribution and can be distinguished as representing the assigned data state in a subsequent read operation.

The data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A-G states is provided in FIG. 20. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

FIG. 10B depicts an example of the verification of different data states in the different program loops of FIG. 10A. The horizontal bars are time-aligned with the program loop axis of FIG. 10A. The bars overlap in some program loops, indicating that verify operations can be performed for multiple data states in the program loop. The bars indicate that VvAi and VvAf, VvBi and VvBf, VvCi and VvCf, VvDi and VvDf, VvEi and VvEf, VvFi and VvFf, and VvGi and VvGf are applied in verification signals in program loops 1-5, 4-8, 7-11, 10-14, 13-17, 16-20 and 18-22, respectively. The techniques provided herein optimize the initiation of verify operations for the B-G data states.

FIG. 11 depicts an example of widened Vth distributions due to over-programming. The plot depicts a number of memory cells on the vertical axis on a logarithmic scale and a Vth on the horizontal axis on a linear scale. The Vth distributions 1100, 1101, 1102, 1103, 1104, 1105 and 1106 are for the A, B, C, D, E, F and G states, respectively. The Vth distributions are obtained by programming memory cells using different initial program voltages and step sizes, such as depicted in FIG. 12. The memory cells are programmed using an adaptive verify process with normal and slow programming speeds similar to FIG. 14A-F. It can be seen that the upper tails of the Vth distributions vary significantly, especially for the B-E states, in this example. The upper tails of the Vth distributions represent over-programming which can lead to read errors.

Over-programming is particularly problematic when the program voltage step size is similar to the distance between the data states, e.g., between the final verify voltages of the data states. See also FIG. 12.

This data demonstrates that over-programming can be caused by factors such as changes to program settings, such as the initial program voltage and the step size of the program voltage, performance variations between different groups of memory cells, such as different word lines, blocks or die, due to fabrication non-uniformities, and performance variations over time. The changes to the program settings can occur as a memory device adaptively optimizes its performance over time. For example, the initial program voltage and/or step size may be lowered to counteract the faster programming speed as PE cycles accumulate. The techniques provided herein avoid or reduce over-programming by combining an optimal adaptive verify process with normal and slow programming speeds in a program operation.

FIG. 12 depicts plots of Vth width versus an initial program voltage, Vpgm_init, for different program voltage step sizes. The vertical axes denote a Vth width and the horizontal axes denote Vpgm_init. Both axes are linear. The step size, dVpgm is 0.3 V, 0.4 V, 0.5 V, 0.6 V, 0.7 V or 0.8 V for plots 1200, 1201, 1202, 1203, 1204 and 1205, respectively. In each plot, the Vth width varies periodically based on the step size as Vpgm_init changes. The peaks in the Vth width are equal to the step size. For some data states, the Vth width can vary by about 100 mV based on a 1 V change in the Vpgm_init. This change in Vpgm_init can be expected among different memory blocks or die due to fabrications variations, for example.

The Vth widths are for an example programmed data state. As the step size increases, the Vth width also increases. This is problematic since a larger step size is desired to decrease the overall programming time. With a relatively larger step size, the judgment of when to initiate the verification for each data state becomes more important. If the verification is initiated too late in the program operation, over-programming can occur. However, it is also desired to avoid initiating the verification too soon, to avoid extra sense operations and an increase in programming time.

FIG. 13A depicts an example programming process which combines an adaptive verify technique with normal and slow programming speeds. At step 1300, a command is received to perform a program operation for a set of memory cells connected to a word line. For example, this could include the set 2100 of memory cells in FIG. 21. The command may be issued by the host 140 and received by the controller 122, for example. Step 1301 begins a program loop. Step 1302 includes applying a program voltage to the word line, and sets bit line voltages for normal and reduced programming speeds, and for inhibiting programming, as discussed, e.g., in connection with FIG. 2. The result of step 1302 is applied to the memory cells in the current program loop. Step 1303 includes applying one or more verification signals to the word lines. Step 1304 includes, during the verification signals, sensing the memory cells. The sensing of a memory cell during a verification signal is a verify test since it tests the Vth of the memory cell relative to the voltage of the verification signal.

In one approach, the sensing can be limited to the memory cells whose assigned data state corresponds to the current verification signal. For example, if the current verification signal is for the A-state and includes VvAi and VvAf, the sensing can be limited to the memory cells which are assigned to the A-state. Optionally, sensing can also occur for the memory cells which are assigned to the B-state, for instance.

Step 1305 includes, based on the sensing, deciding to continue programming of the memory cells using a normal or reduced programming speed, or to inhibit programming in the next program loop. For a memory cell whose Vth remains at or below the initial verify voltage of its assigned data state, it will continue to be subject to the normal programming speed in the next program loop. For a memory cell whose Vth is above the initial verify voltage and at or below the final verify voltage of its assigned data state, it will be subject to the reduced programming speed in the next program loop. For a memory cell whose Vth is above the final verify voltage of its assigned data state, it will be inhibited from programming in the remaining program loops. The determination in step 1305 takes effect in the next program loop.

The initial verify voltage therefore is used to trigger a reduced programming speed and the final verify voltage is used to inhibit programming That is, the reduced programming speed can be triggered or set for a memory cell based on the result of a verification using the initial verify voltage, and the program inhibit can be triggered or set for a memory cell based on the result of a verification using the final verify voltage. The initial verify voltage is configured to trigger a reduced programming speed for memory cells satisfying the initial verify voltage and the final verify voltage is configured to inhibit programming for memory cells satisfying the final verify voltage.

A decision step 1306 determines whether a next program loop should be performed. The decision step is true, and a next program loop begins at step 1301, if programming has not been completed for all data states. Programming is completed for a data state when all or nearly all of the memory cells assigned to the data state are inhibited from programming. If the decision step is false, the program operation is done at step 1307.

Additional steps can be performed based on step 1304 to provide an optimized decision to initiate a verification operation in a subsequent program loop. In particular, step 1308 includes, based on the sensing, counting memory cells subject to the normal programming speed in the current program loop which are non-conductive. These are memory cells which have a Vth greater than a verify voltage. These can be memory cells which are assigned to the same data state of a verification signal of step 1304, as discussed further in FIG. 13B, or to another, higher data state, as discussed further in FIG. 13C. At step 1309, if the count exceeds a threshold, verification is initiated for the higher data state in a subsequent program loop such as the next program loop. Generally, the subsequent program loop can be one or more program loops after the current program loop. The subsequent program loop can be the next program loop, or one or more program loops can be skipped before initiating the verification. The number of program loops to skip can be optimized before the program operation through testing. The number of program loops to skip can be different for different data states.

Figure 22B:
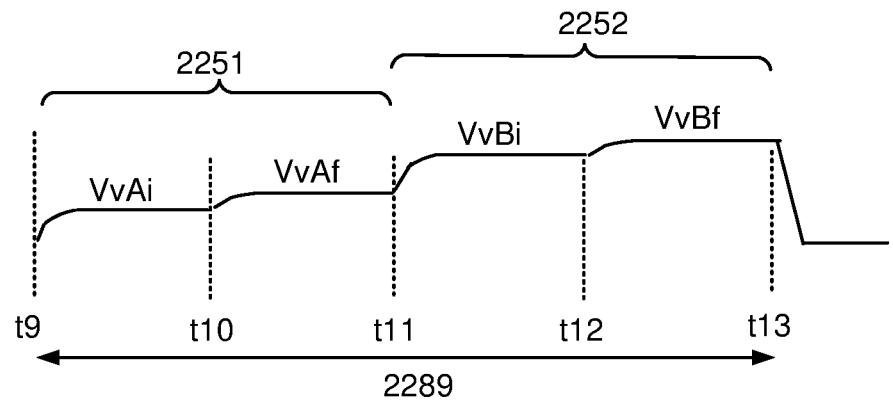
FIG. 22B depicts an expanded view of Vwl_sel in the verify phase 2289 of FIG. 22A.

Note that steps 1303 and 1304 can involve one or more verification signals. The verification signal for a data state can include the initial and final verify voltages of the data state. One or more verification signals can be applied in sequence. FIG. 22B is an example of two verification signals in sequence, one for the A-state and one for the B-state.

The process does not increase the programming time because the existing verification signals are used.

Note that the counting and initiating of steps 1308 and 1309 can be performed for one or more data states. In one approach, the higher data state of step 1309 is a relatively low data state such as the B state, and the initiation of verify operations for other higher data states such as the C state can be based on the program loop in which the verification of the B state was initiated. For example, a program loop to initiate the verification of the C state can be set as three program loops after the program loop which initiates the verification of the B state. This approach optimizes the initiation of verify operations for multiple data states as a group of successive data state rather than optimizing the initiation of verify operations separately for each of the multiple data states. Power consumption can be reduced due to fewer sensing operations.

Another option is to optimize the initiation of verify operations separately for two or more data states which are spaced apart by other data states. For example, a process can optimize the initiation of verify operations separately for the B and E states. The program loop to initiate verify operations for the C and D states can be set based on the program loop to initiate verify operations for the B state, e.g., three and seven program loops later, respectively. The program loop to initiate verify operations for the F and G states can be set based on the program loop to initiate verify operations for the E state, e.g., four and seven program loops later, respectively.

Figure 13B:
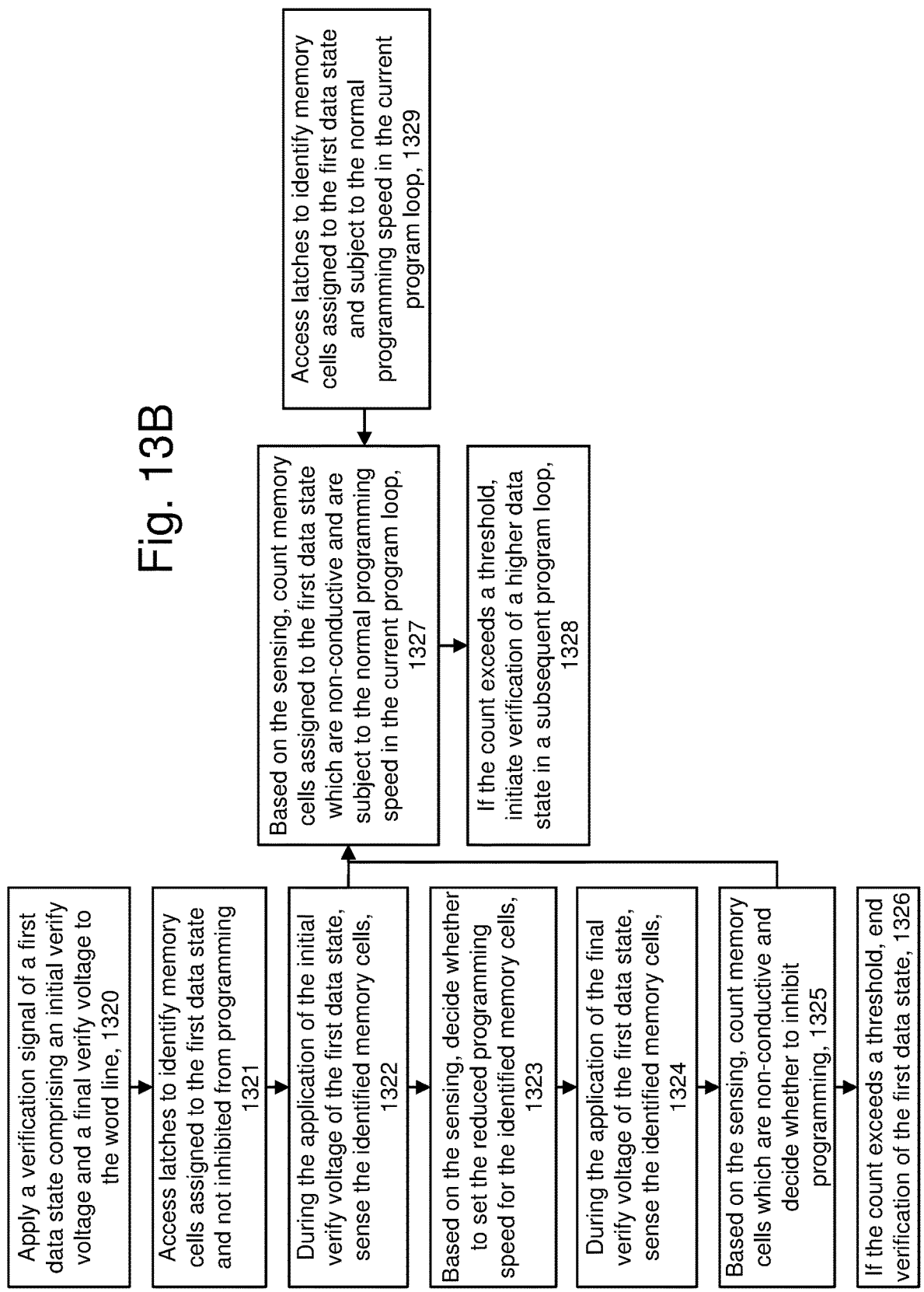
FIG. 13B depicts an example process for implementing steps 1303, 1304, 1308 and 1309 of FIG. 13A, where the verification of memory cells assigned to a first data state with a verification signal of the first data state is used to initiate the verification of memory cells of a second data state with a verification signal of the second data state.

FIG. 13B depicts an example process for implementing steps 1303, 1304, 1308 and 1309 of FIG. 13A, where the verification of memory cells assigned to a first data state with a verification signal of the first data state is used to initiate the verification of memory cells of a second data state with a verification signal of the second data state. This approach provides an optimized decision to initiate a verification operation in a subsequent program loop without performing any extra sensing operations, so that power consumption is minimized Step 1320 includes applying a verification signal of a first data state (e.g., the A-state) comprising an initial verify voltage (e.g., VvAi) and a final verify voltage (e.g., VvAf) to the word line. Step 1321 includes accessing the latches to identify memory cells assigned to the first data state and not inhibited from programming (i.e., identify memory cells assigned to the first data state and subject to the normal or reduced programming speed). Step 1322 includes, during the application of the initial verify voltage of the first data state, sensing the identified memory cells. Step 1323 includes, based on the sensing, deciding whether to set the reduced programming speed for the identified memory cells, as discussed in connection with step 1305.

Step 1324 includes, during the application of the final verify voltage of the first data state, sensing the identified memory cells. Step 1325 includes, based on the sensing, counting memory cells which are non-conductive and deciding whether to inhibit programming, as discussed in connection with step 1305. At step 1326, if the count exceeds a threshold, the verification of the first data state is ended in the program operation. That is, the verification of the first data state is not performed in all subsequent program loops of the program operation.

Additional steps can be performed based on step 1322 or 1325 to provide an optimized decision to initiate a verification operation in a subsequent program loop. In particular, step 1327 includes, based on the sensing, counting memory cells assigned to the first data state which are non-conductive and are subject to the normal programming speed in the current program loop. This count may exclude memory cells assigned to the first data state which are non-conductive and are subject to the reduced programming speed. This step can be based on step 1329, which involves accessing latches to identify memory cells assigned to the first data state and subject to the normal programming speed in the current program loop. At step 1328, if the count exceeds a threshold, verification is initiated for the higher data state in a subsequent program loop such as the next program loop. The count used in step 1328 could be a small fraction of the memory cells assigned to the first data state, such as 1% of these cells. An example threshold is 32 cells for every 1 kB of data.

FIG. 13C depicts an example process for implementing steps 1303, 1304, 1308 and 1309 of FIG. 13A, where the verification of memory cells assigned to a second data state with a verification signal of the first data state is used to initiate the verification of memory cells of the second data state with a verification signal of the second data state.

This approach provides an optimized decision to initiate a verification operation in a subsequent program loop while performing some extra sensing operations. However, power consumption can be minimized by sensing no more than a sample of the memory cells assigned to the second data state at step 1342 or 1344, during the verification signal of the first data state. For example, a simplified example of a set 2100 of memory cells connected to a word line is provided in FIG. 21. The A-state memory cells include memory cells 2101, 2102, 2103 and 2104 and the B-state memory cells include memory cells 2110, 2111, 2112 and 2113. A subset of the B-state memory cells which is sensed could include half of the B-state memory cells such as the memory cells 2110 and 2111.

Additionally, power consumption can be minimized by sensing the memory cells assigned to the second data state at step 1342 or 1344 using a rough sensing. This is a sensing using a reduced bit line voltage, as discussed in connection with FIG. 13H.

Step 1340 includes applying a verification signal of a first data state (e.g., the A-state) comprising an initial verify voltage (e.g., VvAi) and a final verify voltage (e.g., VvAf) to the word line. Step 1341 includes accessing the latches to identify memory cells assigned to the first data state and not inhibited from programming (i.e., identify memory cells assigned to the first data state and subject to the normal or reduced programming speed). Step 1341 also includes identifying memory cells assigned to the second data state. These memory cells will be subject to the normal programming speed because they have not yet been subject to a verify test of their data state.

Step 1342 includes, during the application of the initial verify voltage of the first data state, sensing the identified memory cells assigned to the first data state. In a first option, this step also includes sensing the identified memory cells assigned to the second data state.

Step 1343 includes, based on the sensing, deciding whether to set the reduced programming speed for the identified memory cells of the first data state, as discussed in connection with step 1305.

Step 1344 includes, during the application of the final verify voltage of the first data state, sensing the identified memory cells assigned to the first data state. In a second option, this step also includes sensing the identified memory cells assigned to the second data state. Generally, the first option or the second option can be selected.

Step 1345 includes, based on the sensing, counting memory cells assigned to the first data state which are non-conductive and deciding whether to inhibit programming, as discussed in connection with step 1305. At step 1346, if the count exceeds a threshold, the verification of the first data state is ended in the program operation.

Additional steps can be performed based on step 1342 or 1344 to provide an optimized decision to initiate a verification operation in a subsequent program loop. In particular, step 1347 includes, based on the sensing of step 1342 or 1344, counting memory cells assigned to the second data state which are non-conductive. This count may exclude memory cells assigned to the first data state. This step can be based on step 1349, which involves accessing latches to identify memory cells assigned to the second data state. At step 1348, if the count exceeds a threshold, verification is initiated for the second data state in a subsequent program loop such as the next program loop. The count used in step 1348 could be a small fraction of the memory cells assigned to the first data state, such as 1% of these cells.

FIG. 13D depicts an example process for selecting option 1 or 2 in FIG. 13B or 13C as a function of a number of PE cycles. As mentioned, the memory cells tend to experience a larger increase in Vth with each program voltage as the number of PE cycles increases. This is due to the degradation of the gate oxide of the memory cells. Accordingly, it can be desirable to compensate for this by lowering the verify voltage which is used to initiate the verification of a higher data state in a subsequent program loop. If the compensation is not used, the decision to initiate the verification of the higher program state may occur too late such that over-programming occurs. In one approach, by using the existing initial and final verify voltages of a verification signal, the process does not increase the programming time.

Step 1350 begins a program operation. Step 1351 includes determining a number of program-erase (PE) cycles, such as by using the PE cycle tracking circuit 117 of FIG. 1. If the number of PE cycles is below a threshold (e.g., PE1 in FIG. 13E), step 1352 includes verifying memory cells assigned to a second data state using the higher, final verify voltage of a first data state. This corresponds to option 2 in FIG. 13C. If the number of PE cycles is at or above the threshold, step 1353 includes verifying memory cells assigned to the second data state using lower, the initial verify voltage of the first data state. This corresponds to option 1 in FIG. 13C.

FIG. 13E depicts a plot of a verify voltage for initiating the application of a verification signal as a function of a number of PE cycles, consistent with FIG. 13D. The vertical axis depicts voltage and the horizontal axis depicts a number of PE cycle such as for a block, die or other set of memory cells for which PE cycles are tracked. When the number of PE cycles is between 0 and a number referred to as PE1, the final verify voltages VvAf-VvGf of the data states A-G, respectively, are used. This corresponds to option 2 in FIG. 13C. When the number of PE cycles is at or above PE1, the initial verify voltages VvAi-VvGi of the data states A-G, respectively, are used. This corresponds to option 1 in FIG. 13C.

FIG. 13F depicts a plot of a verify voltage for initiating the application of a verification signal as a function of a number of program loops used to complete a program operation, as an alternative to FIG. 13E. The number of program loops used to complete a program operation decreases as the number of PE cycles increases. The vertical axis depicts voltage and the horizontal axis depicts a number of program loops used to complete a program operation such as for a block, die or other set of memory cells for which program loops are tracked. When the number of program loops is less than a number or threshold referred to as PLx, and the set of memory cells is heavily cycled, the initial verify voltages VvAi-VvGi of the data states A-G, respectively, are used. This corresponds to option 1 in FIG. 13C. When the number of program loops is at or above PLx, and the set of memory cells is fresh, the final verify voltages VvAf-VvGf of the data states A-G, respectively, are used. This corresponds to option 2 in FIG. 13C.

FIG. 13G depicts a plot of a verify voltage for initiating the application of a verification signal as a function of a number of PE cycles, as an alternative to FIG. 13E, where sensing is performed using normal and reduced bit line voltages, Vbl1 and Vbl2, respectively. As discussed, e.g., in connection with FIGS. 13H and 19, the effective verify voltage can be upshifted by reducing the bit line voltage during sensing. Accordingly, up to four verify conditions can be provided for each data state by applying the initial verify voltage with Vbl1 or Vbl2, and by applying the final verify voltage with Vbl1 or Vbl2. The final verify voltage with Vbl2 can be used when the number of PE cycles is less than PE1, the final verify voltage with Vbl1 can be used when the number of PE cycles is between PE1 and PE2, the initial verify voltage with Vbl2 can be used when the number of PE cycles is between PE2 and PE3, and the initial verify voltage with Vbl1 can be used when the number of PE cycles is above PE2. This provides greater flexibility in optimizing the effective verify conditions for different memory devices and as the performance of the memory devices changes over time.

FIG. 13H depicts an example process for sensing the memory cells assigned to the second data state in FIG. 13C, steps 1342 and 1344. Step 1360 includes identifying memory cells to be sensed. This can involve, e.g., accessing the latches of the memory cells to identify a certain assigned data state and determine whether the memory cell is subject to the normal or reduced programming speed. For example, when applying an A-state verification signal in the process of FIG. 13B, the identified memory cells may be those assigned to the A-state which are not inhibited from programming, e.g., which are subject to the normal or reduced programming speed in the current program loop. Step 1361 includes setting the voltage on the sense nodes of sense circuits of the identified memory cells. These are sense nodes connected to the identified memory cells via respective bit lines. For example, the voltage Vsense can be provided to the sense node 171 in FIG. 2.

Step 1362 includes setting a first voltage on bit lines connected to memory cells assigned to the first data state. For example, the selector 56 in FIG. 2 can provide the first voltage Vbl1 on the bit line BL. Step 1363 includes setting a second voltage, lower than first voltage, on bit lines connected to memory cells assigned to the second data state. For example, the selector 56 in FIG. 2 can provide the second voltage Vbl2 on the bit line BL. Step 1364 includes allowing the sense nodes to communicate with the respective bit lines and determining, for each of the sense nodes involved in the sensing, if the sense node voltage decays below a trip voltage at a sense time. See, e.g., FIG. 22C and Vtrip. Step 1365 includes determining that a memory cell is in a non-conductive state if the sense node voltage does not decay below the trip voltage (plot 2253). A memory cell is in a non-conductive state when its Vth exceeds the voltage of the verification signal. This indicates that the memory cell should transition to the reduced programming speed or be inhibited from further programming Step 1366 includes determining that a memory cell is in a conductive state if the sense node voltage decays below the trip voltage (plot 2254 or 2255). A memory cell is in a conductive state when its Vth is below the voltage of the verification signal. This indicates that the memory cell should be programmed further with the normal programming speed before it transitions to a reduced programming speed or is inhibited from further programming.

FIG. 14A-14F depict Vth distributions of memory cells in program loops 1-6, respectively, of an example program operation, where a verification of A-state memory cells at a final verify voltage VvAf, including A-state memory cells subject to a reduced programming speed, is used to initiate the verification of B-state memory cells in a subsequent program loop, resulting in over-programming of the B-state memory cells. In FIG. 14A-16B, 18 and 19, the vertical axis depicts a count of memory cells on a logarithmic scale and the horizontal axis depicts Vth for the A and B-states on a linear scale. For simplicity, the Vth of the remaining states is not shown.

FIG. 14A depicts the Vth distribution 910a of the memory cells in the erased state at the start of the program operation, consistent with FIG. 9. After the program voltage is applied in the first program loop, the Vth distributions 1400 and 1401 represent the B-G state and A-state memory cells, respectively. The Vth distributions are relatively wide at this point since all memory cells are subject to the normal programming speed. Verify operations are performed using a verification signal of the A-state. Thus, sensing is performed while VvAi and then VvAf are applied. The sensing performed using VvAi indicates that a portion of the Vth distribution 1401 is above VvAi. The latches of the associated memory cells are set to implement the reduced programming speed in the next program loop. In this example, the B-G state cells are not sensed during the verification signal of the A-state.

In FIG. 14B, after the program voltage is applied in the second program loop, the Vth distributions 1402 and 1403 represent the A-state and B-G state memory cells, respectively. The Vth distribution for the A-state is relatively narrow since some of these memory cells are subject to the reduced programming speed while others are subject to the normal programming speed. The Vth distribution for the B-G states continues to be relatively wide since all of these memory cells are subject to the normal programming speed. Verify operations are performed using a verification signal of the A-state. In this example, the upper tail of the Vth distribution 1402 is below VvAf so that none of the A-state cells will be inhibited from programming in the next program loop. Additional A-state memory cells will have a Vth which exceeds VvAi but not VvAf and these cells will be subject to the reduced programming speed. The upper tail of the Vth distribution 1403 is between VvBi and VvBf, so that some of the B-state memory cells will have a Vth in this range. However, no verification operation is performed for the B-state memory cells using the B-state verification signal so that the B-state memory cells will continue to be programmed with the normal programming speed in the next program loop.

In FIG. 14C, after the program voltage is applied in the third program loop, the Vth distributions 1404, 1405 and 1406 represent the A-state, C-G state and B-state memory cells, respectively. The Vth distribution for the A-state is further narrowed since most of these memory cells are subject to the reduced programming speed. The Vth distributions for the B-state and the C-G states continue to be relatively wide since all of these memory cells are subject to the normal programming speed. Verify operations are performed using a verification signal of the A-state. In this example, the upper tail of the Vth distribution 1404 is above VvAf so that the corresponding A-state cells will be inhibited from programming in the next program loop. Assuming a count of the A-state memory cells exceeds a threshold, the verification of the B-state memory cells in the next program loop is triggered. A region 1404a of the Vth distribution 1404 represents the A-state memory cells used to trigger the verification of the B-state memory cells. In this example, the verification is triggered by A-state memory cells which are subject to the reduced programming speed and possibly the normal programming speed as well.

Additional A-state memory cells will have a Vth which exceeds VvAi but not VvAf and these cells will be subject to the reduced programming speed in the next program loop. The upper tail of the Vth distribution 1406 is above VvBf. However, no verification operation is performed for the B-state memory cells using the B-state verification signal so that the B-state memory cells will continue to be subject to the normal programming speed in the next program loop.

Figure 14D:
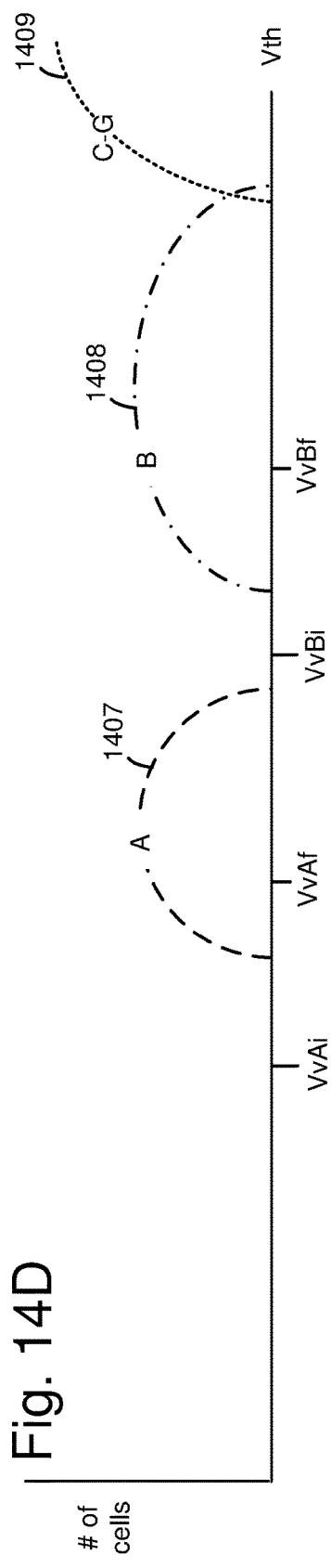

In FIG. 14D, after the program voltage is applied in the fourth program loop, the Vth distributions 1407, 1408 and 1409 (shown partially) represent the A-state, B-state and C-G state memory cells, respectively. The lower tail of Vth distribution for the A-state is shifted above VvAf for the A-state memory cells subject to the reduced programming speed. The Vth distributions for the B-state and the C-G states continue to be relatively wide since all of these memory cells are still subject to the normal programming speed. Verify operations are performed using a verification signal of the A-state and a verification signal of the B-state. Part of the Vth distribution 1407 is above VvAf so that the corresponding A-state cells will inhibited from programming in the next program loop. Additional A-state memory cells have a Vth which exceeds VvAi but not VvAf and these cells will remain subject to the reduced programming speed.

When the B-state verification signal is applied and the B-state memory cells are sensed, it is determined that a portion of the Vth distribution 1408 is above VvBf. In response, the associated B-state memory cells are inhibited from programming in the next program loop. Additionally, it is determined that a portion of the Vth distribution 1408 is between VvBi and VvBf. In response, the associated B-state memory cells are subject to the reduced programming speed in the next program loop.

Figure 14E:
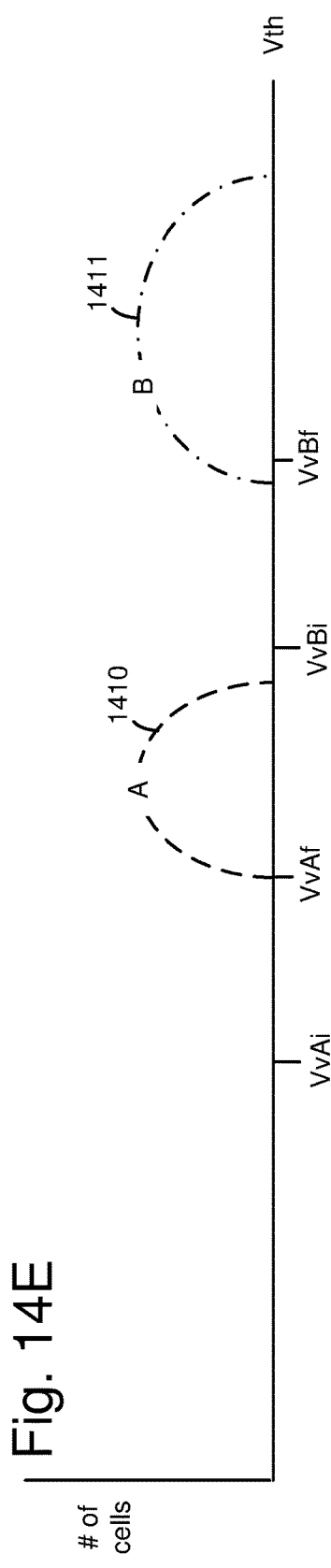

In FIG. 14E, after the program voltage is applied in the fifth program loop, the Vth distribution 1410 represents the A-state memory cells, and the Vth distribution 1411 represents the B-state memory cells. The Vth distribution for the B-state memory cells increases for the B-state memory cells subject to the reduced programming speed. The verify operations using a verification signal of the A-state indicate that the A-state memory cells have completed programming since their Vth is above VvAf. The verify operations using a verification signal of the B-state indicate that most, but not all, of the B-state memory cells have completed programming.

Figure 14F:
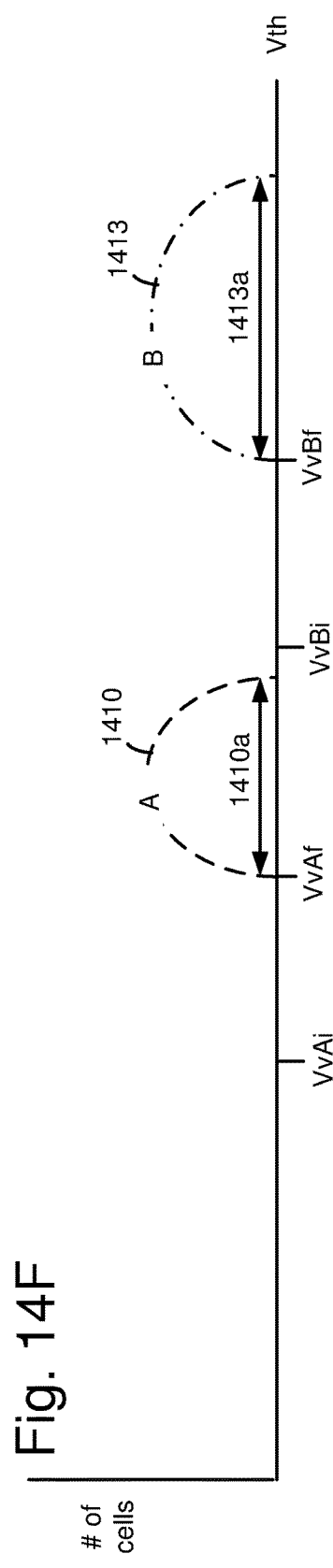

In FIG. 14F, after the program voltage is applied in the sixth program loop, the Vth distribution 1410 continues to represent the A-state memory cells, and the Vth distribution 1413 represents the B-state memory cells. The B-state memory cells have now completed programming since their Vth is above VvBf. The B-state memory cells have a Vth width (arrow 1413a) which is significantly larger than the Vth width of the A-state memory cells (arrow 1410a). This demonstrates over-programming of the B-state memory cells when the decision to initiate verification of the B-state memory cells using the B-state verification signal is based on a count of A-state memory cells which have a Vth exceeding VvAf, and the count includes A-state memory cells subject to the reduced programming speed.

The decision to initiate the verification of the B-state memory cells using the B-state verification signal occurs in the third program loop, and this verification is initiated in the fourth program loop. This is the first program loop in the series of program loops of the program operation in which the B-state memory cells are verified using the B-state verification signal.

Note that the example of FIG. 14A-14F is consistent with FIG. 10B.

The examples below reduce over-programming compared to the example of FIG. 14A-14F.

FIG. 15A-15F depict Vth distributions of memory cells in program loops 1-6, respectively, of an example program operation, where a verification of A-state memory cells at an initial verify voltage VvAi is used to initiate the verification of B-state memory cells in a subsequent program loop, consistent with FIG. 13B, step 1322.

FIG. 15A depicts the Vth distribution 910a at the start of the program operation, and the Vth distributions 1400 and 1401 after the program voltage is applied in the first program loop. These Vth distributions are the same as in FIG. 14A. Additionally, a region 1401a of the Vth distribution 1401 represents the A-state memory cells having a Vth greater than VvAi. A count of these memory cells is used to trigger the verification of the B-state memory cells in the next program loop, the second program loop, using the B-state verification signals. This is two program loops sooner than the fourth program loop discussed in connection with FIG. 14A-14F. Verify operations are performed using a verification signal of the A-state. The A-state memory cells of the region 1401a may all be subject to the normal programming speed, for example.

In FIG. 15B, after the program voltage is applied in the second program loop, the Vth distributions 1402, 1500 and 1501 represent the A-state memory cells, C-G state memory cells, and B-state memory cells, respectively. The Vth distribution for the B and C-G states continues to be relatively wide since all of these memory cells are subject to the normal programming speed. Verify operations are performed using a verification signal of the A-state. A verification operation is also performed for the B-state memory cells using the B-state verification signal so that the B-state memory cells with a Vth>VvBi will be subject to the reduced programming speed in the next program loop. This is the first program loop in the series of program loops of the program operation in which the B-state memory cells are verified using the B-state verification signal.

In FIG. 15C, after the program voltage is applied in the third program loop, the Vth distributions 1404, 1405 and 1502 represent the A-state memory cells, C-G state memory cells, and B-state memory cells. The Vth distribution for the B-state is narrowed compared to the Vth distribution 1501 since some of these memory cells are subject to the reduced programming speed. For example, compare the width of the Vth distribution 1502 to the Vth distribution 1406 in FIG. 14C. B-state cells with a Vth between VvBi and VvBf will be subject to the reduced programming speed in the next program loop. B-state cells with a Vth above VvBf will be inhibited from further programming.

The Vth distributions for the C-G states continue to be relatively wide since all of these memory cells are subject to the normal programming speed. Verify operations are performed using verification signals of the A-state and the B-state.

Figure 15D:
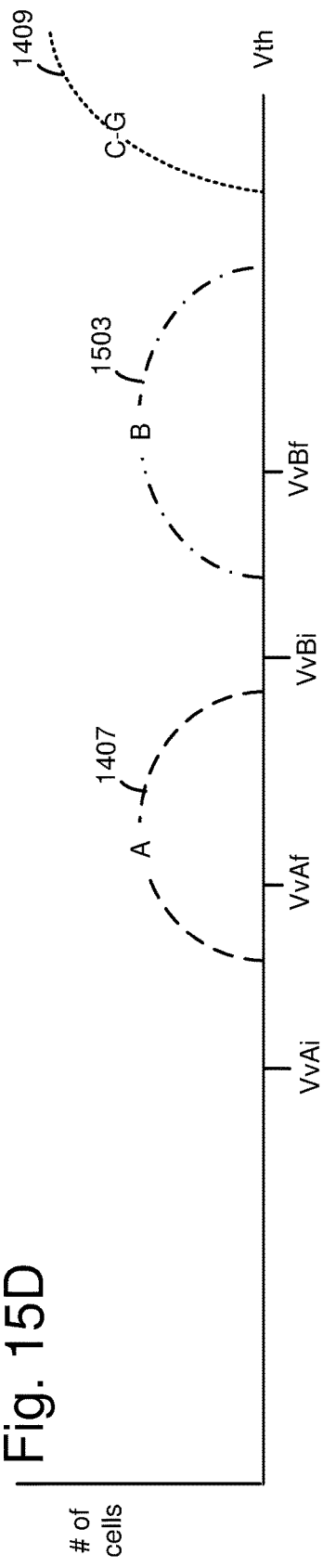

In FIG. 15D, after the program voltage is applied in the fourth program loop, the Vth distributions 1407, 1503 and 1409 (shown partially) represent the A-state memory cells, B-state memory cells, and C-G state memory cells, respectively. The Vth distributions for the A and B-states are shifter higher. Verify operations are performed using verification signals of the A and B-states. When the B-state verification signal is applied and the B-state memory cells are sensed, some of them will be subject to the reduced programming speed and some of them will be inhibited from further programming in the next program loop.

Figure 15E:
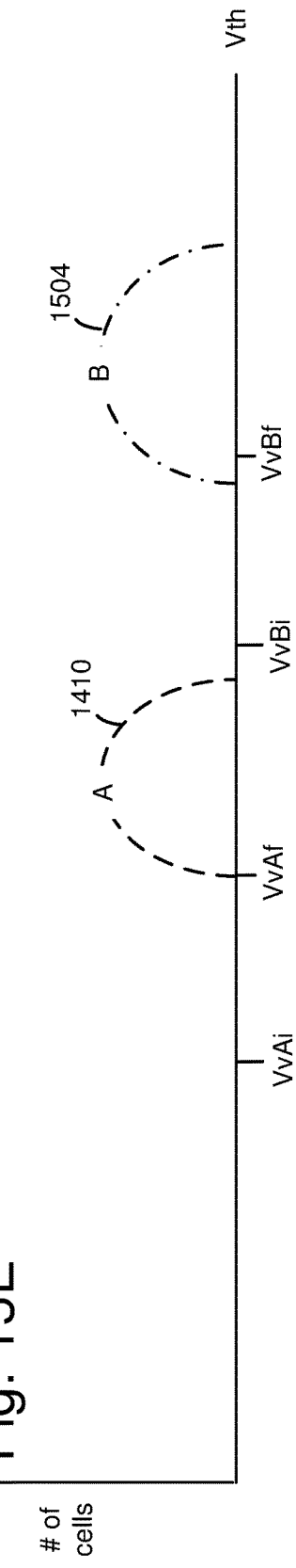

In FIG. 15E, after the program voltage is applied in the fifth program loop, the Vth distributions 1410 and 1504 represent the A-state memory cells and B-state memory cells, respectively. The verify operations using a verification signal of the A-state indicate that the A-state memory cells have completed programming. The verify operations using a verification signal of the B-state indicate that most, but not all, of the B-state memory cells have completed programming.

Figure 15F:
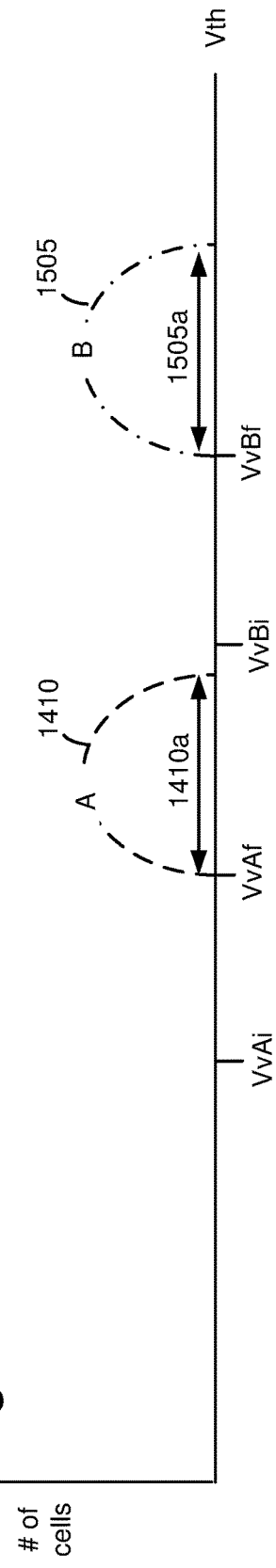

In FIG. 15F, after the program voltage is applied in the sixth program loop, the Vth distribution 1410 continues to represent the A-state memory cells, and the Vth distribution 1505 represents the B-state memory cells. The B-state memory cells have now completed programming since their Vth is above VvBf. The B-state memory cells have a Vth width (arrow 1505a) which is about the same as the Vth width of the A-state memory cells (arrow 1410a). This demonstrates that over-programming of the B-state memory cells is avoided when the decision to initiate verification of the B-state memory cells using the B-state verification signal is based on a count of A-state memory cells which have a Vth exceeding VvAi, such that the A-state memory cells are subject to the normal programming speed. The decision to initiate the verification of the B-state memory cells using the B-state verification signal occurs in the first program loop, and this verification is initiated in the second program loop.

FIG. 16A depicts Vth distributions of memory cells in program loop 1 of an example program operation, where a verification of B-state memory cells at an initial verify voltage VvAi is used to initiate the verification of B-state memory cells in a subsequent program loop, consistent with FIG. 13C, step 1342.

FIG. 16A depicts the Vth distribution 910a at the start of the program operation, and the Vth distribution 1600 for the A and C-G state memory cells and the Vth distribution 1601 for the B-state memory cells after the program voltage is applied in the first program loop. Additionally, a region 1601a of the Vth distribution 1601 represents the B-state memory cells having a Vth greater than VvAi. A count of these memory cells is used to trigger the verification of the B-state memory cells in the next program loop, the second program loop, using the B-state verification signals. These memory cells are subject to the normal programming speed so that the trigger occurs sufficiently early in the program operation. This is two program loops sooner than the fourth program loop discussed in connection with FIG. 14A-14F. Verify operations are performed for the A-state memory cells using both the initial and final verify voltages of the verification signal of the A-state. Verify operations are performed for the B-state memory cells using the initial verify voltage of the verification signal of the A-state. Thus, when the initial verify voltage VvAi is applied to the selected word line, both the A and B-state memory cells are sensed.

FIG. 16B depicts Vth distributions of memory cells in a program loop of an example program operation, where a verification of B-state memory cells at a final verify voltage VvAf is used to initiate the verification of B-state memory cells in a subsequent program loop, consistent with FIG. 13C, step 1344. A Vth distribution 1650 is for the A and C-G state memory cells and a Vth distribution 1651 is for the B-state memory cells after the program voltage is applied in a program loop.

A region 1651a of the Vth distribution 1651 represents the B-state memory cells having a Vth greater than VvAf. A count of these memory cells is used to trigger the verification of the B-state memory cells in the next program loop using the B-state verification signals. These memory cells are subject to the normal programming speed so that the trigger occurs sufficiently early in the program operation. Verify operations are performed for the A-state memory cells using both the initial and final verify voltages of the verification signal of the A-state. Verify operations are performed for the B-state memory cells using the final verify voltage of the verification signal of the A-state. Thus, when the final verify voltage VvAf is applied to the selected word line, both the A and B-state memory cells are sensed.

Recall that FIGS. 14A-16B involve the A and B-state memory cells as examples only. The techniques can be applied to other data states as well.

FIG. 17 depicts example increases in Vth for two memory cells in one program loop, where one memory cell has a Vth which increases from below VvAi to above VvAf (arrow 1700), and another memory cell has a Vth which increase from between VvAi and VvAf, to above VvAf (arrow 1701). When a program voltage is applied, different memory cells can have a different increase in Vth. On average, the increase in Vth is about the same as the program voltage step size. In some cases, a memory cell can have its Vth increase from below the initial verify voltage to above the final verify voltage in one program loop. It can be useful to obtain a count of these memory cells to determine when to begin verify operations for a higher data state, since these memory cells have not been subject to the reduced programming speed. As a result, the decision of when to begin verify operations for a higher data state is not delayed and over-programming is avoided. During sensing, these cells can be identified by accessing their latches to confirm that their PML bit is set to indicate they are subject to the normal programming speed. See FIG. 20.

Other memory cells will have their Vth increase from a region between toe initial and final verify voltage, to above the final verify voltage in one program loop. These cells can be identified by accessing their latches to confirm that their PML bit is set to indicate they are subject to the reduced programming speed. The count can exclude these memory cells.

FIG. 18 depicts a Vth distribution 1800 which is an alternative to the Vth distribution 1404 of FIG. 14C, where regions 1800a and 1800b of the Vth distribution are consistent with the arrows 1700 and 1701, respectively, of FIG. 17, and where verification of A-state memory cells at a final verify voltage VvAf includes A-state memory cells subject to a normal programming speed but not a reduced programming speed, to initiate the verification of B-state memory cells in a subsequent program loop. This Vth distribution may be used to obtain a count of A-state memory cells which triggers the verification of B-state memory cells in a subsequent program loop, consistent with FIG. 13B, step 1325. In one approach, the A-state memory cells associated with the region 1800a are used to obtain the count. These are A-state memory cells which are subject to the normal programming speed in the current program loop as well the previous program loops. By obtaining the count using the A-state memory cells which are subject to the normal programming speed and excluding the A-state memory cells which are subject to the reduced programming speed, the initiation of the verification of the higher data state occurs sooner in the program operation so that the over-programming of FIG. 14F can be avoided.

FIG. 19 depicts a Vth distribution 1900 which is upshifted relative to the Vth distribution 1601 of FIG. 16A, and which may be obtained by sensing using a reduced bit line voltage (Vbl2) instead of a normal bit line voltage (Vbl1), consistent with FIG. 13H. When the bit line voltage is reduced during the sensing which occurs in a verify operation, the amount of current flowing in the NAND string is reduced. The amount of discharge of the sense node is similarly reduced. As a result, a memory cell which is sensed using a reduced bit line voltage will not pass the verify test until its Vth is slightly higher, compared to a memory cell which is sensed using a normal bit line voltage. The Vth distribution will therefore appear to be shifted slightly higher compared to the case where the sensing uses the normal bit line voltage (Vbl1). However, this shift may be acceptable when sensing memory cells using the verification signal of another data state, such as when sensing B-state memory cells using the verification signal of the A-state. These sensed memory cells will be programmed subsequently to their final Vth using the normal bit line voltage. Power savings can result from using a reduced bit line voltage.

The region 1900a of the Vth distribution represents B-state memory cells for which VvAi when sensing occurs using a reduced bit line voltage. This region represents the count of FIG. 13H, step 1344 and 1347. The region 1900a of FIG. 19 is similar to the region 1601a so that the initiating of the verification of the B-state will likely occur in the same program loop in either case. That is, the count of memory cells in the regions 1900a and 1601a will likely both exceed a threshold which trigger the verification of the B-state or other higher data state.

FIG. 20 depicts example values in the latches of FIG. 2 during a program operation, consistent with FIG. 13B, steps 1321 and 1329 and FIG. 13C, step 1341 and 1349. A 0 or 1 bit is depicted for each of the latches UDL, MDL, LDL and PML. Each column indicates a different configuration or sequence of bits of the latches. The column titled Er/Inhibit indicates that, for memory cells which are assigned to the erased state or which are inhibited from programming, the latches have all 1's. The remaining columns identify memory cells which are subject to a normal or reduced programming speed by a 0 or 1 bit, respectively, in the PML latch. The UDL, MDL and LDL latches together provide a sequence of 3 bits which identify the assigned data state of a memory cell. When a memory cell transitions from the normal programming speed to the reduced programming speed, the PML bit is flipped from 0 to 1. Thus, a PML latch=0 or 1 denotes the normal or reduced programming speed, respectively. When a memory cell is inhibited from programming, any UDL, MDL and LDL latches with 0 are flipped to 1. By accessing the latches, a determination can be made in each program loop indicating whether a memory cell is subject to the normal programming speed or the reduced programming speed, or is inhibited from programming.

FIG. 21 depicts an example set 2100 of memory cells connected to a word line selected for programming, consistent with FIG. 13A, step 1300. This simplified example includes 32 memory cells, with 4 memory cells of each of 8 data states. Each memory cell is represented by a square and the assigned data state (Er-G) is represented by a letter inside the square. The A-state memory cells include memory cells 2101, 2102, 2103 and 2104 and the B-state memory cells include memory cells 2110, 2111, 2112 and 2113. Note that a memory cell which is assigned to a data state is configured to store data of the data state.

The set 2100 may represent a plurality of memory cells connected to a word line. The plurality of memory cells are configured to store data in a plurality of data states Er-G. The plurality of data states include a first data state (e.g., A) and a second data state (e.g., B). The memory cells configured to store data in the first or second data states may include the memory cells 2101-2104 and 2110-2113, respectively.

FIG. 22A depicts examples of voltage signals which can be used in a program loop of a program operation, consistent with FIG. 13A, steps 1301-1304. The period of time depicted corresponds to one program loop and includes a pre-charge phase 2287 (t0-t3), a program phase 2288 (t3-t9) and a verify phase 2289 (t9-t13). The vertical dimension denotes voltage and the horizontal dimension denotes time, with time points t0-t13. A voltage signal 2250 represents Vwl_sel, the voltage of the selected word line, a voltage signal 2260 represents Vwl_unsel, a voltage of unselected word lines, a voltage signal 2270 represents the select gate voltages, e.g., Vsgd and/or Vsgs, and a voltage signal 2280 represents Vbl, a bit line voltage.

In the pre-charge phase, a positive Vbl, e.g., 2 V, is provided to the drain-side of the channels of the NAND strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end of the channel. The SGS transistors of the selected and unselected sub-blocks may also be in a conductive state at this time, with a voltage of 6 V, for example, to allow the source line voltage (Vsl) to be passed to the source end of the channel.

In the program phase, the word line voltages are ramped up, e.g., starting at t3, to provide the associated memory cells in a conductive state and to provide a capacitive coupling up of the associated channel regions of the unselected NAND strings. Vwl_sel is then ramped up further at t5 to the peak program voltage of Vpgm and held at Vpgm until t6 to program the selected memory cells.

In the verify phase, one or more verify tests are performed by applying verification signals 2251 and 2252 of one or more data states on the selected word line. In this example, a verification signal 2251 for the A-state includes the initial (first) verify voltage VvAi and the final (second) verify voltage VvAf, and the verification signal 2252 for the B-state includes the initial (first) verify voltage VvBi and the final (second) verify voltage VvBf. During the application of each verify voltage, selected memory cells are sensed to determine if they are in a conductive or non-conductive state.

Vwl_unsel may be the same in the verify phase as the program phase, in one approach. This voltage is referred to as Vpass in the program phase and Vread in the verify phase. In one option, Vwl_unsel is kept at Vpass/Vread between the program and verify phases. In another option, Vwl_unsel is reduced from Vpass/Vread to 0 V at the end of the program phase and then increased from 0 V to Vpass/Vread at the start of the verify phase.

Vwl_sel is at an initial voltage such as 0 V during the pre-charge phase. Vwl_sel then increases from the initial voltage to Vpass, starting at t3, in a time period t3-t4, and is held at Vpass from t4-t5. Vwl_sel then increases from Vpass to Vpgm starting at t5, and is held at a peak voltage Vpgm until t6. Vwl_sel then decreases from Vpgm back to the initial voltage starting at t6 and is held at the initial voltage until t9. During the verify phase, Vwl_sel increases in steps to one or more verify voltages. For example, Vwl_sel may increase from 0 V to VvAi at t9, from VvAi to VvAf at t10, from VvAf to VvBi at t11, from VvBi to VvBf at t12, and from VvBf back to the initial voltage at t13.

The voltage signal 2270 represents the select gate voltages including the select gate voltage Vsg_sel for a selected sub-block (plot 2271) and the select gate voltage Vsg_unsel for an unselected sub-block (plot 2272).

The voltage signal 2280 represents the bit line voltages including Vbl_norm (e.g., 0 V) for selected bit lines connected to memory cells subject to the normal programming speed (plot 2281), Vbl_slow (e.g., 0.5-1.0 V) for selected bit lines connected to memory cells subject to the reduced programming speed (plot 2282), and Vbl_inh (e.g., 2 V) for unselected bit lines connected to memory cells inhibited from programming (plot 2283).

During the program and verify phases, Vsg_sel can be set to, e.g., 2.5 V and 0 V, respectively, for the selected sub-block (plot 2271) and the unselected sub-blocks (plot 2272). Vbl can be set to Vbl1 (voltage signal 2284) or Vbl2 (voltage signal 2285), for example, as discussed, during the verify phase as part of a sensing process in which the bit lines are charged up.

Vpass/Vread represents a voltage which is a voltage which is sufficiently high to place the associated memory cells in a strongly conductive state.

FIG. 22B depicts an expanded view of Vwl_sel in the verify phase 2289 of FIG. 22A. The verify signal 2251 of the A-state includes a portion having the voltage VvAi from t9-t10 and a portion having the voltage VvAf from t10411. The verify signal 2252 of the B-state includes a portion having the voltage VvBi from t11-t12 and a portion having the voltage VvBf from t12-t13. This is an example only, as the verify phase can include verify signals for one or more data states.

Figure 22C:
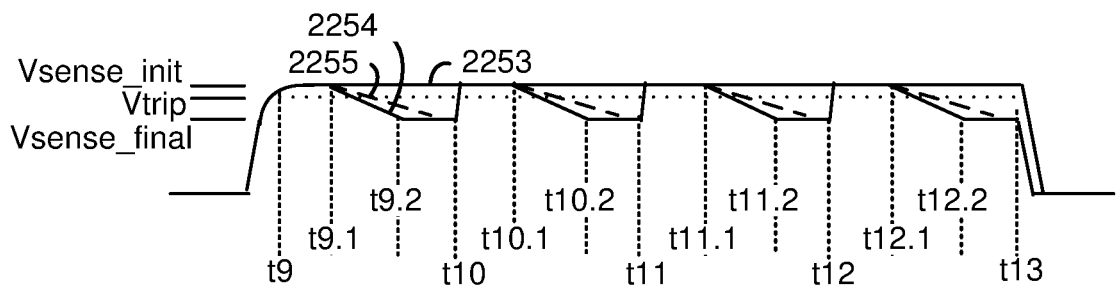
FIG. 22C depicts example voltages of the sense node 171 of FIG. 2 during verify operations consistent with the verify phase 2289 of FIG. 22A and with FIG. 22B.

FIG. 22C depicts example voltages 2253-2255 of the sense node 171 of FIG. 2 during verify operations consistent with the verify phase 2289 of FIG. 22A and with FIG. 22B. As mentioned, the sensing process can involve connected a sense node of a sense circuit to a bit line and observing whether the sense node voltage discharges below a trip voltage. The voltages include Vsense_init, which is the initial sense node voltage such as 3 V, Vtrip which is the trip voltage such as 2.5 V, and Vsense_final which is a floor voltage for Vsense, such as 2 V. The period in which the sense node can discharge is t9.1-t10, t10.1411, t11.1-t12 and t12.1-t13 during sensing with VvAi, VvAf, VvBi or VvBf, respectively, applied to the word line. The sense time in which the sense node voltage is compared to Vtrip is t9.2, t10.2, t11.2 or t12.2 during sensing with VvAi, VvAf, VvBi or VvBf, respectively, applied to the word line.

Figure 23:
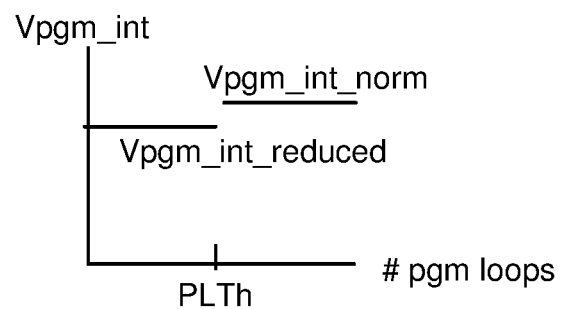
FIG. 23 depicts a plot of Vpgm_init versus a number of program loops used to complete a program operation.

FIG. 23 depicts a plot of Vpgm_init versus a number of program loops used to complete a program operation. As discussed, e.g., in connection with FIG. 12, the Vth width can vary as a function of Vpgm_init and step size. In some cases, the Vpgm_init for a block, die or other set of memory cells can be adjusted based on the number of program loops used to complete a program operation. As the memory device is used, the programming becomes faster such that fewer program loops are used. To compensate, and avoid over-programming, Vpgm_int can be reduced when the number of program loops exceeds a threshold. In this example, Vpgm_init is set to a normal level, Vpgm_init_norm, when the memory device is fresh. When the number of program loops falls below a threshold PLth, Vpgm_init is lowered to a reduced level, Vpgm_init_reduced.

The step size could also be reduced when the number of program loops falls below a threshold. The variations in Vpgm_init and step size, as well as physical variations due to fabrication non-uniformities, can be addressed by the adaptive verify techniques described herein.

In one implementation, an apparatus comprises: a plurality of memory cells connected to a word line, the plurality of memory cells configured to store data in a first data state and a second data state; a programming circuit connected to the memory cells, the programming circuit configured to program the memory cells in a program loop by applying a program voltage to the word line followed by a verification signal of the first data state, the verification signal of the first data state comprises an initial verify voltage configured to trigger a reduced programming speed for memory cells satisfying the initial verify voltage and a final verify voltage configured to inhibit programming for memory cells satisfying the final verify voltage; sense circuits connected to the memory cells and configured to detect, during the verification signal of the first data state, memory cells among the plurality of memory cells which are in a non-conductive state and are not subject to the reduced programming speed in the program loop; and a counting circuit connected to the sense circuits and configured to obtain a count of the memory cells which are in the non-conductive state and which are not subject to the reduced programming speed in the program loop, the programming circuit configured to initiate application of a verification signal of the second data state to the word line in a subsequent program loop in response to the counting circuit determining that the count exceeds a threshold.

In another implementation, a method comprises: performing a series of program loops for a plurality of memory cells connected to a word line, the plurality of memory cell comprise memory cells configured to store data in a first data state and memory cells configured to store data in a second data state, and the plurality of memory cells are subject to a normal programming speed followed by a reduced programming speed; during a program loop of the series of program loops, accessing latches associated with the plurality of memory cells to identify memory cells which are subject to the normal programming speed and have not completed programming, and determining a count of the identified memory cells which pass a verify test of the first data state; and if a count of the identified memory cells exceeds a threshold, initiating a verify test for the second data state in a subsequent program loop of the series of program loops.

In another implementation, an apparatus comprises: a plurality of memory cells connected to a word line, the plurality of memory cells comprise memory cells configured to store data in a first data state and memory cells configured to store data in a second data state; a programming circuit connected to the memory cells, the programming circuit, to perform a program loop in a program operation, configured to apply a program voltage to the word line followed by a verification signal of the first data state; and sense circuits configured to detect, during the verification signal of the first data state, a number of the memory cells configured to store data in the second data state which are in a non-conductive state, the programming circuit configured to initiate application of a verification signal of the second data state to the word line in a subsequent program loop in response to the number exceeding a threshold.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a circuit configured to connect to a plurality of memory cells connected to a word line, the circuit is configured to:
program the memory cells in a program loop by applying a program voltage to the word line followed by applying a verification signal of a first data state, the verification signal of the first data state comprises an initial verify voltage and a final verify voltage, the initial verify voltage is configured to trigger a reduced programming speed for memory cells which are configured to store data in the first data state and the final verify voltage is configured to trigger a program inhibit for the memory cells which are configured to store data in the first data state;
during the verification signal of the first data state, obtain a count of memory cells among the plurality of memory cells which are in a non-conductive state and are not subject to the reduced programming speed in the program loop; and
initiate application of a verification signal of a second data state to the word line in a subsequent program loop when the count exceeds a threshold.

2. The apparatus of claim 1, wherein:
the count is of memory cells configured to store data in the first data state and memory cells configured to store data in the second data state.

3. The apparatus of claim 2, wherein:
during the applying of the verification signal of the first data state, the circuit is configured to charge bit lines connected to the memory cells configured to store data in the first data state to a first voltage and to charge bit lines connected to the memory cells configured to store data in the second data state to a second voltage, lower than the first voltage.

4. The apparatus of claim 2, wherein:
during the verification signal of the first data state, the circuit is configured to sense the memory cells configured to store data in the second data state and to sense the memory cells configured to store data in the first data state, wherein the sensing of the memory cells configured to store data in the second data state has a reduced accuracy compared to the sensing of the memory cells configured to store data in the first data state.

5. The apparatus of claim 2, wherein:
during the verification signal of the first data state, the circuit is configured to sense the memory cells configured to store data in the second data state and to sense the memory cells configured to store data in the first data state, wherein the sensing of the memory cells configured to store data in the second data state has a reduced power consumption compared to the sensing of the memory cells configured to store data in the first data state.

6. The apparatus of claim 1, wherein:
the count is of no more than a sample of memory cells of the plurality of memory cells which are configured to store data in the second data state.

7. The apparatus of claim 1, wherein:
the count is of memory cells configured to store data in the first data state but not memory cells configured to store data in the second data state.

8. The apparatus of claim 1, wherein:
the second data state is one data state higher than the first data state in a sequence of data states.

9. The apparatus of claim 1, wherein:
the second data state is more than one data state higher than the first data state in a sequence of data states.

10. The apparatus of claim 1, wherein:
the circuit is configured to obtain the count during the final verify voltage of the verification signal when a number of program-erase cycles of the plurality of memory cells is below a threshold, and during the initial verify voltage of the verification signal when the number of program-erase cycles of the plurality of memory cells is above the threshold.

11. The apparatus of claim 1, wherein:
the circuit is configured to obtain the count during the initial verify voltage of the verification signal.

12. The apparatus of claim 1, wherein:
the plurality of memory cells are on a chip and the circuit is off the chip.

13. A method, comprising:
performing a series of program loops for a plurality of memory cells connected to a word line, the plurality of memory cell comprise memory cells assigned to a first data state and memory cells assigned to a second data state, and the plurality of memory cells are subject to a normal programming speed followed by a reduced programming speed;
during a program loop of the series of program loops, accessing latches associated with the plurality of memory cells to identify memory cells which are subject to the normal programming speed, and determining a count of the identified memory cells which pass a verify test of the first data state; and
if a count of the identified memory cells exceeds a threshold, initiating a verify test for the memory cells assigned to the second data state in a subsequent program loop of the series of program loops.

14. The method of claim 13, wherein:
the identified memory cells are assigned to the first data state.

15. The method of claim 13, wherein:
the identified memory cells comprise the memory cells assigned to the first data state and the memory cells assigned to the second data state.

16. An apparatus, comprising:
a circuit configured to perform a program loop in a program operation for a plurality of memory cells, wherein the plurality of memory cells comprise memory cells which are configured to store data in a first data state and memory cells which are configured to store data in a second data state, and to perform the program loop, the circuit is configured to:
apply a program voltage followed by a verification signal of the first data state to the plurality of memory cells;
detect, during the verification signal of the first data state, memory cells configured to store data in the first data state which are in a non-conductive state and memory cells configured to store data in the second data state which are in the non-conductive state, wherein to detect the memory cells configured to store data in the first data state which are in the non-conductive state, the circuit is configured to charge bit lines connected to the memory cells configured to store data in the first data state to a first voltage, and to detect the memory cells configured to store data in the second data state which are in the non-conductive state, the circuit is configured to charge bit lines connected to the memory cells configured to store data in the second data state to a second voltage, lower than the first voltage; and
apply a verification signal of the second data state to the plurality of memory cells in a subsequent program loop in response to the detecting of the memory cells configured to store data in the second data state which are in the non-conductive state.

17. The apparatus of claim 16, wherein:
the circuit is configured to count a number of the memory cells configured to store data in the second data state which are in the non-conductive state and to apply the verification signal in response to the number exceeding a threshold.

18. The apparatus of claim 16, wherein:
the circuit is configured to inhibit further programming of the memory cells configured to store data in the first data state which are in the non-conductive state.

19. The apparatus of claim 16, wherein:
the detecting of the memory cells configured to store data in the first data state which are in the non-conductive state is concurrent with the detecting of the memory cells configured to store data in the second data state which are in the non-conductive state.

20. The apparatus of claim 16, wherein:
the plurality of memory cells are on a chip and the circuit is off the chip.

* * * * *